US012666907B2

(12) United States Patent
Green et al.

(10) Patent No.: US 12,666,907 B2
(45) Date of Patent: **\*Jun. 23, 2026**

(54) ENCLOSURE SYSTEM SHELF INCLUDING ALIGNMENT FEATURES

(71) Applicant: Applied Materials, Inc., Santa Clara, CA (US)

(72) Inventors: Aaron Green, Sunnyvale, CA (US); Nicholas Michael Bergantz, Sunnyvale, CA (US); John C. Menk, Round Rock, TX (US)

(73) Assignee: Applied Materials, Inc., Santa Clara, CA (US)

( \* ) Notice: Subject to any disclaimer, the term of this patent is extended or adjusted under 35 U.S.C. 154(b) by 0 days.

This patent is subject to a terminal disclaimer.

(21) Appl. No.: 18/759,704

(22) Filed: Jun. 28, 2024

(65) Prior Publication Data

US 2024/0429079 A1     Dec. 26, 2024

Related U.S. Application Data

(63) Continuation of application No. 17/206,036, filed on Mar. 18, 2021, now Pat. No. 12,027,397.

(Continued)

(51) Int. Cl.
*H01L 21/673*       (2006.01)
*H10P 72/10*       (2026.01)
(52) U.S. Cl.
CPC ................................. *H10P 72/1921* (2026.01)
(58) Field of Classification Search
CPC .......... H01L 21/68735; H01L 21/6732; H01L 21/6735; H01L 21/67369; H01L 21/673;

(Continued)

(56) References Cited

U.S. PATENT DOCUMENTS

| 4,707,247 A | 11/1987 | Savoy |
| D311,177 S | 10/1990 | Peters, III |

(Continued)

FOREIGN PATENT DOCUMENTS

| EP | 1434256 A2 | 6/2004 |
| JP | H10165884 A | 6/1998 |

(Continued)

OTHER PUBLICATIONS

Entegris: "F300 Autopod, Wafer Carrier, Clean, Secure Wafer Transport and Optimum Automation Integration," 2 Pages, [Retrieved on May 20, 2019], Retrieved from URL: https://www.entegris.com/content/dam/shared-product-assets/wafer-processing/datasheet-f300-foup-6073.pdf.

(Continued)

*Primary Examiner* — Jonathan Liu
(74) *Attorney, Agent, or Firm* — Lowenstein Sandler LLP

(57)         ABSTRACT

A shelf system includes a first distal portion configured to be fastened to a first surface of an enclosure system. The first distal portion includes a first carrier alignment feature and a first process kit ring alignment feature. The shelf system further includes a second distal portion configured to be fastened to a second surface of the enclosure system. The second distal portion includes a second carrier alignment feature and a second process kit ring alignment feature. The first carrier alignment feature and the second carrier alignment feature are configured to be disposed proximate outer surfaces of a carrier to align the carrier in the enclosure system. The first process kit ring alignment feature and the second process kit ring alignment feature are configured to be proximate inner surfaces of a process kit ring to align the process kit ring on the carrier in the enclosure system.

20 Claims, 16 Drawing Sheets

Related U.S. Application Data

(60) Provisional application No. 63/158,259, filed on Mar. 8, 2021, provisional application No. 62/993,518, filed on Mar. 23, 2020.

(58) Field of Classification Search
CPC ......... H01L 21/67383; H01L 21/67346; H01L 21/68707; H01L 21/68; H01L 21/68714
USPC ....... 211/41.18; 414/935, 936; 206/710, 711, 206/832; 312/265.5
See application file for complete search history.

(56) References Cited

U.S. PATENT DOCUMENTS

| | | | |
|---|---|---|---|
| 5,169,684 A | 12/1992 | Takagi | |
| 5,316,472 A | 5/1994 | Niino et al. | |
| 5,577,621 A * | 11/1996 | Yi | H01L 21/67309 |
| | | | 211/41.18 |
| 5,749,469 A | 5/1998 | Williams | |
| 5,957,292 A | 9/1999 | Mikkelsen et al. | |
| 6,145,673 A | 11/2000 | Burrows et al. | |
| 6,171,400 B1 | 1/2001 | Wingo | |
| 6,176,023 B1 | 1/2001 | Doche | |
| 6,199,291 B1 | 3/2001 | Ozee | |
| 6,398,033 B1 | 6/2002 | Wu et al. | |
| 6,676,759 B1 | 1/2004 | Takagi | |
| D488,153 S | 4/2004 | Tosh et al. | |
| 7,048,316 B1 | 5/2006 | Blank et al. | |
| 7,219,802 B2 | 5/2007 | Wiseman et al. | |
| 7,661,544 B2 | 2/2010 | Herzog | |
| 7,792,350 B2 | 9/2010 | Kiley et al. | |
| D665,387 S | 8/2012 | Hsiao | |
| 8,318,275 B2 | 11/2012 | Kudo et al. | |
| 8,384,033 B2 | 2/2013 | Burns et al. | |
| 8,397,739 B2 | 3/2013 | Gregor et al. | |
| 8,784,033 B2 | 7/2014 | Kremerman et al. | |
| 8,857,619 B1 | 10/2014 | Yang et al. | |
| 8,940,096 B2 | 1/2015 | Asari et al. | |
| 8,940,097 B2 | 1/2015 | Hasebe | |
| 9,153,466 B2 | 10/2015 | Jdira et al. | |
| 9,457,464 B2 | 10/2016 | Kremerman et al. | |
| 9,579,788 B2 | 2/2017 | Rosenberg et al. | |
| D792,389 S | 7/2017 | Keisling et al. | |
| D802,582 S | 11/2017 | Krivonak et al. | |
| 9,881,820 B2 | 1/2018 | Wong et al. | |
| 9,947,517 B1 | 4/2018 | Luere et al. | |
| 10,008,402 B1 | 6/2018 | Ogitsu | |
| 10,014,198 B2 | 7/2018 | Richardson | |
| 10,041,868 B2 | 8/2018 | Gottscho | |
| 10,043,695 B1 | 8/2018 | Chang | |
| 10,062,589 B2 | 8/2018 | Wong et al. | |
| 10,062,590 B2 | 8/2018 | Wong et al. | |
| 10,062,599 B2 | 8/2018 | Genetti et al. | |
| 10,103,010 B2 | 10/2018 | Luere et al. | |
| 10,124,492 B2 | 11/2018 | Genetti et al. | |
| 10,651,097 B2 | 5/2020 | Sevillano et al. | |
| 11,361,981 B2 | 6/2022 | Patel et al. | |
| 11,367,639 B2 | 6/2022 | Song et al. | |
| 11,367,641 B2 | 6/2022 | Wu et al. | |
| D980,176 S * | 3/2023 | Green | D13/182 |
| 12,027,397 B2 * | 7/2024 | Green | H01L 21/67383 |
| 2001/0042697 A1 | 11/2001 | Yajima et al. | |
| 2002/0020650 A1 | 2/2002 | Fujimori et al. | |
| 2005/0205502 A1 | 9/2005 | Brown et al. | |
| 2005/0247594 A1 | 11/2005 | Mimura et al. | |
| 2006/0013674 A1 | 1/2006 | Elliott et al. | |
| 2006/0061979 A1 | 3/2006 | Elliott et al. | |
| 2006/0226094 A1 | 10/2006 | Cho et al. | |
| 2006/0278564 A1 | 12/2006 | Obayashi et al. | |
| 2007/0006803 A1 | 1/2007 | Cadwell et al. | |
| 2007/0134904 A1 | 6/2007 | Wan et al. | |
| 2007/0231110 A1 | 10/2007 | Akiyama | |
| 2007/0295638 A1 | 12/2007 | Nakatogawa | |
| 2008/0041761 A1 | 2/2008 | Nakatogawa | |
| 2010/0194015 A1 | 8/2010 | Vekstein et al. | |

| | | | |
|---|---|---|---|
| 2010/0206767 A1 | 8/2010 | Odashima et al. | |
| 2013/0068656 A1 | 3/2013 | Sheng et al. | |
| 2014/0367307 A1 | 12/2014 | Oyama et al. | |
| 2015/0030416 A1 | 1/2015 | Sakiya et al. | |
| 2015/0041353 A1 | 2/2015 | Adams et al. | |
| 2015/0279711 A1 | 10/2015 | Matsutori et al. | |
| 2015/0340209 A1 | 11/2015 | Koltonski | |
| 2016/0141194 A1 | 5/2016 | Kirkland et al. | |
| 2016/0211165 A1 | 7/2016 | McChesney et al. | |
| 2016/0211166 A1 | 7/2016 | Yan et al. | |
| 2016/0216185 A1 | 7/2016 | Gottscho | |
| 2017/0053819 A1 | 2/2017 | Richardson | |
| 2017/0113355 A1 | 4/2017 | Genetti et al. | |
| 2017/0115657 A1 | 4/2017 | Trussell et al. | |
| 2017/0117172 A1 | 4/2017 | Genetti et al. | |
| 2017/0119339 A1 | 5/2017 | Johnson et al. | |
| 2017/0133283 A1 | 5/2017 | Kenworthy | |
| 2017/0213758 A1 | 7/2017 | Rice et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0263478 A1 | 9/2017 | McChesney et al. | |
| 2017/0287682 A1 | 10/2017 | Musselman et al. | |
| 2017/0287753 A1 | 10/2017 | Musselman et al. | |
| 2017/0330786 A1 | 11/2017 | Genetti et al. | |
| 2017/0334074 A1 | 11/2017 | Genetti et al. | |
| 2017/0372930 A1 | 12/2017 | Schober et al. | |
| 2018/0019107 A1 | 1/2018 | Ishizawa | |
| 2018/0019142 A1 | 1/2018 | Wong et al. | |
| 2018/0032062 A1 | 2/2018 | Trussell et al. | |
| 2018/0040492 A1 | 2/2018 | Wong et al. | |
| 2018/0068879 A1 | 3/2018 | Wong et al. | |
| 2018/0090354 A1 | 3/2018 | Sugita et al. | |
| 2018/0122674 A1 | 5/2018 | Dovids et al. | |
| 2018/0166259 A1 | 6/2018 | Ueda | |
| 2018/0218933 A1 | 8/2018 | Luere et al. | |
| 2018/0233328 A1 | 8/2018 | Ueda et al. | |
| 2018/0277416 A1 | 9/2018 | Takahashi et al. | |
| 2018/0301322 A1 | 10/2018 | Sugita et al. | |
| 2018/0315583 A1 | 11/2018 | Luere et al. | |
| 2018/0315640 A1 | 11/2018 | Ueda et al. | |
| 2019/0088531 A1 | 3/2019 | Sarode Vishwanath et al. | |
| 2019/0244845 A1 | 8/2019 | Parathithasan et al. | |
| 2020/0122320 A1 | 4/2020 | Yoshida et al. | |
| 2020/0373190 A1 | 11/2020 | Lee et al. | |
| 2021/0292104 A1 | 9/2021 | Green et al. | |
| 2021/0296149 A1 | 9/2021 | Green et al. | |
| 2022/0285180 A1 | 9/2022 | Menk et al. | |
| 2024/0429079 A1 * | 12/2024 | Green | H01L 21/67346 |

FOREIGN PATENT DOCUMENTS

| | | | |
|---|---|---|---|
| JP | 2009095783 A | 5/2009 | |
| JP | 2010206232 A | 9/2010 | |
| JP | 4559317 B2 | 10/2010 | |
| JP | 2012216614 A | 11/2012 | |
| KR | 20160016409 A | 2/2016 | |
| KR | 101901460 B1 | 9/2018 | |
| KR | 102616325 B1 | 12/2023 | |
| WO | 2017186172 A1 | 11/2017 | |
| WO | 2018112055 A2 | 6/2018 | |
| WO | 2018226800 A1 | 12/2018 | |
| WO | 2019097832 A1 | 5/2019 | |
| WO | 2019156918 A1 | 8/2019 | |
| WO | WO-2021194977 A1 * | 9/2021 | ....... H01L 21/67346 |

OTHER PUBLICATIONS

Entegris: "Spectra Foup, Front Opening Unified Pod Platform with Superior Microenvironment Control," 2 Pages, [Retrieved on May 20, 2019] Retrieved from URL: https://www.entegris.com/content/dam/shared-product-assets/wafer-processing/datasheet-spectra-foup-2413.pdf.

International Preliminary Report on Patentability for International Application No. PCT/US2021/023501, mailed Oct. 6, 2022, 7 Pages.

(56) References Cited

OTHER PUBLICATIONS

International Search Report and Written Opinion for International Application No. PCT/US2020/033774, mailed Sep. 1, 2020, 14 Pages.
International Search Report and Written Opinion for International Application No. PCT/US2021/023501, mailed Jul. 12, 2021, 9 Pages.

\* cited by examiner

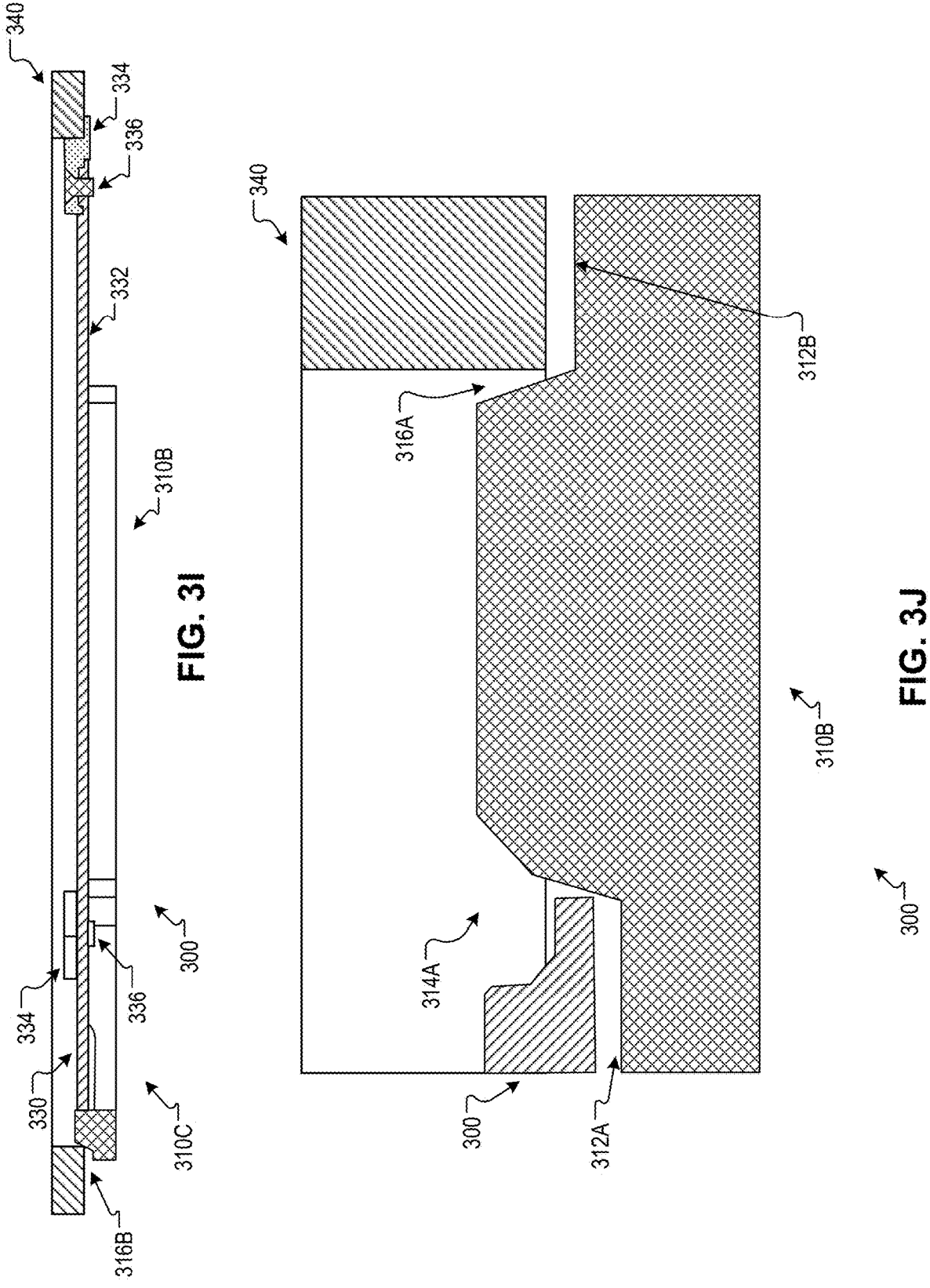

ENCLOSURE SYSTEM SHELF INCLUDING ALIGNMENT FEATURES

RELATED APPLICATION

This application is a continuation of U.S. patent application Ser. No. 17/206,036, filed Mar. 18, 2021, which claims benefit of U.S. Provisional Patent Application 62/993,518, filed Mar. 23, 2020, and U.S. Provisional Patent Application 63/158,259, filed Mar. 8, 2021, the entire contents of which are incorporated by reference herein.

TECHNICAL FIELD

Embodiments of the present disclosure relate to shelves, such as those used in association with wafer processing systems, and in particular to enclosure system shelves configured to support process kit rings and/or carriers for process kit rings.

BACKGROUND

In semiconductor processing and other electronics processing, platforms are often used that use robotic arms to transport objects, such as wafers, between processing chambers, from storage areas (e.g., front opening unified pods (FOUPs)) to processing chambers, from processing chambers to storage areas, and so on. A processing system, such as a wafer processing system, has one or more processing chambers for processing of wafers. A gas is used to etch a wafer in a processing chamber (e.g., a wafer is etched while electrostatically clamped in position in an etch chamber). The robotic arms are to pick up objects from specific locations and transport the objects to specific other locations.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a set of one or more shelves is configured to be disposed within an enclosure system of a substrate processing system. The set of one or more shelves includes first upper surfaces disposed substantially in a first plane, carrier alignment features configured to align a carrier on the first upper surfaces, second upper surfaces disposed substantially in a second plane that is above the first plane, and process kit ring alignment features configured to align a process kit ring on the carrier above the second upper surfaces.

In another aspect of the disclosure, an enclosure system is of a substrate processing system. The enclosure system includes a plurality of surfaces that at least partially enclose an interior volume of the enclosure system, and a set of one or more shelves at least partially disposed within the interior volume of the enclosure system. The set of one or more shelves includes a plurality of carrier alignment features configured to align a carrier on the set of one or more shelves in a first plane and a plurality of process kit ring alignment features configured to align a process kit ring on the carrier in a second plane above the first plane.

In another aspect of the disclosure, a method includes transporting a carrier supporting a process kit ring to a position above a set of one or more shelves disposed within an enclosure system of a substrate processing system and, responsive to lowering the carrier supporting the process kit ring, causing the carrier to align on the set of one or more shelves via a plurality of carrier alignment features of the set of one or more shelves.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 3A-J illustrates one or more shelves of an enclosure system, according to certain embodiments.

DETAILED DESCRIPTION OF EMBODIMENTS

Figure 1:
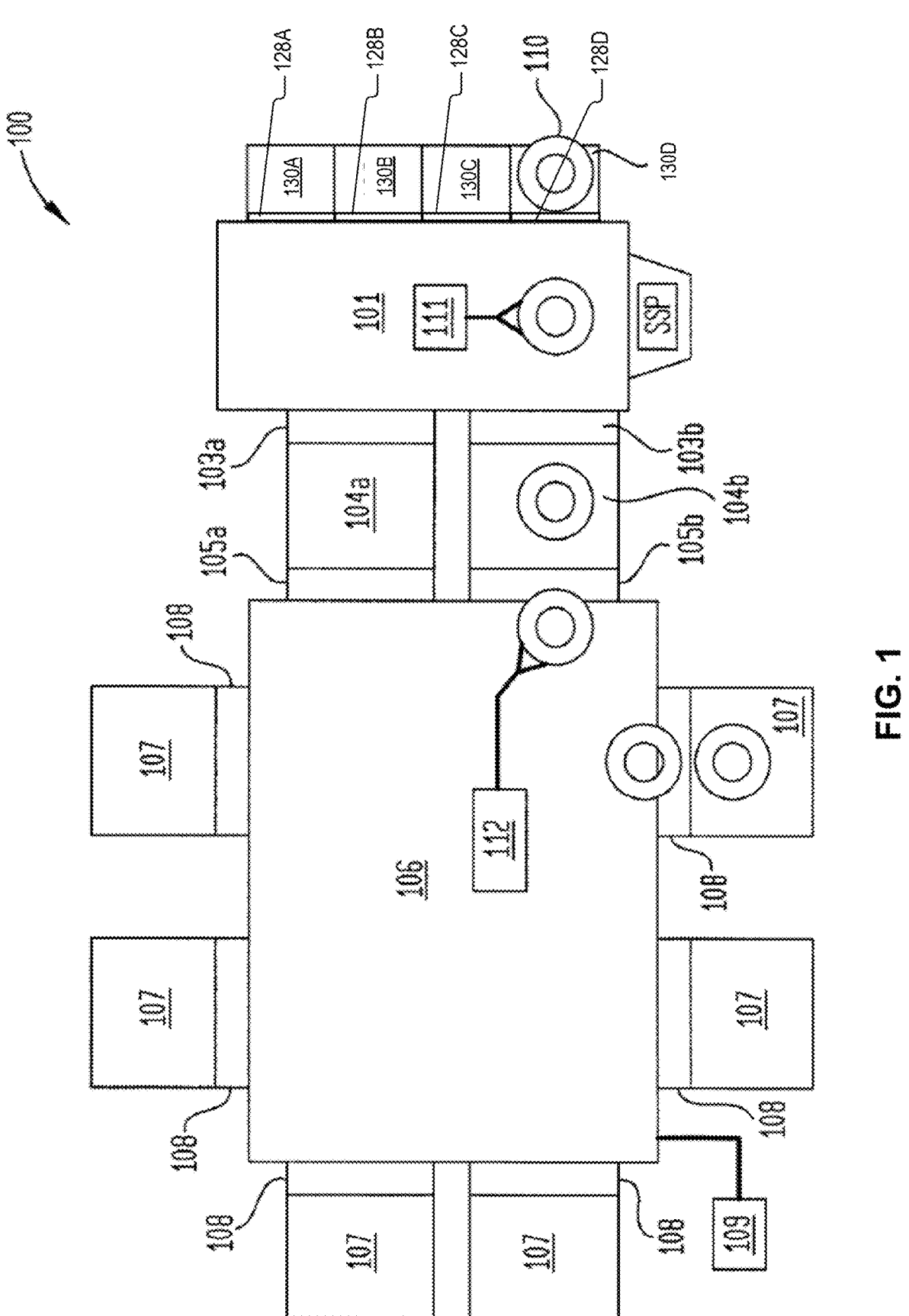
FIG. 1 illustrates a processing system, according to certain embodiments.

Embodiments described herein are related to an enclosure system shelf.

A wafer processing system includes a factory interface and a transfer chamber. An enclosure system (e.g., FOUP) is mounted to the factory interface and processing chambers are mounted to the transfer chamber. Process kit rings are disposed within the processing chambers to protect components of the processing chambers. Over time, process kit rings become worn and are to be replaced.

Robot arms are used to transfer content within the wafer processing system. Robot arms are used to transfer wafers from an enclosure system to one or more processing chambers to be processed and back to the enclosure system. Robot arms are used to transport used process kit rings from processing chambers to an enclosure system and to transport new process kit rings from the enclosure system to the processing chambers. In some instances, robot arms use carriers (e.g., adaptors) to transfer process kit rings. For example, a carrier is disposed on the robot arm and other content is disposed on the carrier.

Content is to be placed by robot arms in specific locations and is to be picked up by robot arms from specific locations. In embodiments, an enclosure system secures content (e.g., carriers and/or process kit rings) in specific locations. In embodiments, by securing the content in the specific locations, an ability of robot arms to pick up the content from source locations is increased, and the ability of the robot arms to then place the content in specific target locations is also increased.

Error is introduced into the placement of content. Such error can be introduced by robot error, misalignment of chambers to one another, improper placement of content in storage locations (e.g., in containers) and/or shifting of the content within the storage locations. For example, one or more of a local center finding (LCF) device, alignment device, robot arm, or the like introduce error in the placement of content (e.g., carrier supporting a process kit ring) within an enclosure system. In some instances, erroneously placed content is not substantially horizontal (e.g., sits up on the edge of a support structure) in the enclosure system. In some instances, an enclosure system cannot secure erroneously placed content during transportation which causes more error in placement of the content, damage to the content, and/or damage to the enclosure system. In some instances, a robot arm cannot retrieve erroneously placed content from an enclosure system. In some instances, erroneously placed content in the enclosure system is transferred in an erroneous orientation (e.g., via the robot arm) and causes damage to the content, damage to the wafer processing system, misalignment of the content, and/or erroneous processing of the content.

The devices, systems, and method disclosed herein provide one or more shelves configured to be disposed in an enclosure system (e.g., FOUP) of a processing system (e.g., wafer processing system, substrate processing system, semiconductor processing system). In some embodiments, a single shelf is configured to support content (e.g., a carrier, a process kit ring disposed on a carrier, a placement validation wafer, etc.). The shelf includes a first portion and a second portion. The first portion includes a first upper surface in a first plane, a second upper surface in a second plane above the first plane, first carrier alignment features, and first process kit ring alignment features. The second portion includes a third upper surface in the first plane, a fourth upper surface in the second plane, second carrier alignment features, and second process kit ring alignment features. The first and second carrier alignment features are configured to align a carrier on (e.g., contacting, disposed above) the first and third upper surfaces. The first and second process kit ring alignment features are configured to align a process kit ring on (e.g., contacting, disposed above) the second and fourth upper surfaces.

In some embodiments, the first portion and the second portion include attachment features (e.g., an opening to receive a fastener, a fastener, etc.) configured to attach the shelf to the enclosure system.

In some embodiments, the shelf further includes a third portion disposed between the first and second portions, where the third portion includes a third process kit ring alignment feature configured to align the process kit ring on the shelf above the carrier. In some embodiments, the first, second, and third portions of the shelf form a "U"-shape, where the first portion is a first side, the second portion is a second side, and the third portion is a rear side that is disposed between the first and second sides. In some embodiments, the first, second, and third portions of the shelf are integral to each other. In some embodiments, the first, second, and third portions of the shelf are attached to each other.

One or more of the carrier and/or process kit ring alignment features include a corresponding sidewall. In some embodiments, a sidewall includes a lower portion that is at about a 100 to 110 degree angle from the first plane and an upper portion that is at about a 130 to 140 degree angle from the first plane.

In some embodiments, the first and second carrier alignment features include first sidewalls that are configured to prevent x-direction movement and yaw movement of the carrier. In some embodiments, the first and second carrier alignment features first include second sidewalls that are configured to prevent y-direction movement of the carrier. In some embodiments, the first and third upper surfaces are configured to prevent z-direction movement, pitch movement, and roll movement of the carrier.

In some embodiments, the process kit ring alignment features include sidewalls that are configured to prevent yaw movement of the process kit ring. In some embodiments, the sidewalls have about a 100 to 110 degree angle from the first plane. In some embodiments, the carrier is configured to prevent x-direction movement, y-direction movement, z-direction movement, pitch movement, and roll movement of the process kit ring.

In some embodiments, the shelf further includes one or more carrier retaining devices configured to secure the carrier to the shelf and one or more process kit ring retaining devices configured to secure the process kit ring to the shelf.

In some embodiments, a carrier supporting a process kit ring is transported (e.g., via a robot arm) to a position above the shelf disposed within the enclosure system (e.g., FOUP). Responsive to lowering (e.g., via the robot arm) the carrier supporting the process kit ring, the process kit ring aligns on the shelf via the process kit ring alignment features of the shelf and the carrier aligns on the shelf via the carrier alignment features of the shelf. In some embodiments, the process kit ring is secured to the shelf via one or more first retaining devices and the carrier is secured to the shelf via one or more second retaining devices responsive to the lowering of the carrier supporting the process kit ring.

In some embodiments, instead of a single shelf that has a first portion to support a first distal end of content (e.g., a carrier, etc.) and a second portion to support a second distal end of the content (e.g., the carrier, etc.), a first shelf is used to support the first distal end of the content and a second shelf (e.g., coplanar with the first shelf) is used to support a second distal end of the content.

The devices, systems, and methods disclosed herein have advantages over conventional solutions. The shelf aligns content that is erroneously placed in the enclosure system. In some embodiments, the shelf aligns both a carrier and a process kit ring in the enclosure system. The shelf aligning content (e.g., carrier and/or process kit ring) prevents damage to the content, prevents damage to the enclosure system, prevents transfer of the content in an erroneous orientation, prevents damage to the wafer processing system, and prevents erroneous processing of the content. The shelf retains the content placed on the shelf which prevents damage to the content and the enclosure system, prevents misaligning of the content on the shelf, and the like.

Although portions of the present description refer to process kit rings and carriers, the present description can be applied to different types of content. Although portions of the present description refer to substrate processing systems, the present description can be applied to other types of systems.

Although portions of the present description refer to a shelf that includes different portions that support different portions of content (e.g., process kit rings, carriers, etc.), in some embodiments, the different portions of the shelf can be distinct components that are not connected to each other. In some examples, a first portion of the shelf that is configured to support a first distal end of a carrier and the second portion of the shelf that is configured to support a second distal end of the carrier are two distinct component (e.g., two distinct shelves of a set of shelves that are coplanar).

Although portions of the present description refer to sidewalls of particular ranges of slopes, in some embodiments, a curved sidewall may be used (e.g., that has an average change in rise over run that approximates a slope from the particular range of slopes) and/or multiple slopes may be used on the same sidewall (e.g., where the entire sidewall has an average change in rise over run that approximates a slope from the particular range of slopes).

FIG. 1 illustrates a processing system 100 (e.g., wafer processing system, substrate processing system, semiconductor processing system) according to certain embodiments. The processing system 100 includes a factory interface 101 and load ports 128 (e.g., load ports 128A-D). In some embodiments, the load ports 128A-D are directly mounted to (e.g., seal against) the factory interface 101. Enclosure systems 130 (e.g., cassette, FOUP, process kit enclosure system, or the like) are configured to removably couple (e.g., dock) to the load ports 128A-D. Referring to FIG. 1, enclosure system 130A is coupled to load port 128A, enclosure system 130B is coupled to load port 128B, enclosure system 130C is coupled to load port 128C, and enclosure system 130D is coupled to load port 128D. In some embodiments, one or more enclosure systems 130 are coupled to the load ports 128 for transferring wafers and/or other substrates into and out of the processing system 100. Each of the enclosure systems 130 seal against a respective load port 128. In some embodiments, a first enclosure system 130A is docked to a load port 128A (e.g., for replacing used process kit rings). Once such operation or operations are performed, the first enclosure system 130A is then undocked from the load port 128A, and then a second enclosure system 130 (e.g., a FOUP containing wafers) is docked to the same load port 128A. In some embodiments, an enclosure system 130 (e.g., enclosure system 130A) is an enclosure system with shelves for aligning carriers and/or process kit rings.

In some embodiments, a load port 128 includes a front interface that forms a vertical opening (or a substantially vertical opening). The load port 128 additionally includes a horizontal surface for supporting an enclosure system 130 (e.g., cassette, process kit enclosure system). Each enclosure system 130 (e.g., FOUP of wafers, process kit enclosure system) has a front interface that forms a vertical opening. The front interface of the enclosure system 130 is sized to interface with (e.g., seal to) the front interface of the load port 128 (e.g., the vertical opening of the enclosure system 130 is approximately the same size as the vertical opening of the load port 128). The enclosure system 130 is placed on the horizontal surface of the load port 128 and the vertical opening of the enclosure system 130 aligns with the vertical opening of the load port 128. The front interface of the enclosure system 130 interconnects with (e.g., clamp to, be secured to, be sealed to) the front interface of the load port 128. A bottom plate (e.g., base plate) of the enclosure system 130 has features (e.g., load features, such as recesses or receptacles, that engage with load port kinematic pin features, a load port feature for pin clearance, and/or an enclosure system docking tray latch clamping feature) that engage with the horizontal surface of the load port 128. The same load ports 128 that are used for different types of enclosure systems 130 (e.g., process kit enclosure system, cassettes that contain wafers, etc.).

In some embodiments, enclosure system 130 includes one or more sets of one or more shelves for aligning carriers and/or process kit rings. In some embodiments, enclosure system 130 includes one set of one or more shelves for aligning a carrier and/or content (e.g., process kit ring, processing chamber component, etc.) disposed on the carrier. In some embodiments, enclosure system 130 includes three sets of one or more shelves for aligning carriers and/or process kit rings. In some embodiments, enclosure system 130 includes six sets of one or more shelves for aligning carriers and/or process kit rings. In some embodiments, enclosure system 130 includes eight sets of one or more shelves for aligning carriers and/or process kit rings.

In some embodiments, the enclosure system 130 (e.g., process kit enclosure system) includes one or more items of content 110 (e.g., one or more of a process kit ring, an empty process kit ring carrier, a process kit ring disposed on a process kit ring carrier, a placement validation wafer, etc.). In some examples, the enclosure system 130 is coupled to the factory interface 101 (e.g., via load port 128) to enable automated transfer of a process kit ring on a process kit ring carrier into the processing system 100 for replacement of a used process kit ring.

In some embodiments, the processing system 100 also includes first vacuum ports 103a, 103b coupling the factory interface 101 to respective degassing chambers 104a, 104b. Second vacuum ports 105a, 105b are coupled to respective degassing chambers 104a, 104b and disposed between the degassing chambers 104a, 104b and a transfer chamber 106 to facilitate transfer of wafers and content 110 (e.g., process kit rings) into the transfer chamber 106. In some embodiments, a processing system 100 includes and/or uses one or more degassing chambers 104 and a corresponding number of vacuum ports 103, 105 (e.g., a processing system 100 includes a single degassing chamber 104, a single first vacuum port 103, and a single second vacuum port 105). The transfer chamber 106 includes a plurality of processing chambers 107 (e.g., four processing chambers 107, six processing chambers 107, etc.) disposed therearound and coupled thereto. The processing chambers 107 are coupled to the transfer chamber 106 through respective ports 108, such as slit valves or the like. In some embodiments, the factory interface 101 is at a higher pressure (e.g., atmospheric pressure) and the transfer chamber 106 is at a lower pressure (e.g., vacuum). Each degassing chamber 104 (e.g., load lock, pressure chamber) has a first door (e.g., first vacuum port 103) to seal the degassing chamber 104 from the factory interface 101 and a second door (e.g., second vacuum port 105) to seal the degassing chamber 104 from the transfer chamber 106. Content is to be transferred from the factory interface 101 into a degassing chamber 104 while the first door is open and the second door is closed, the first door is to close, the pressure in the degassing chamber 104 is to be reduced to match the transfer chamber 106, the second door is to open, and the content is to be transferred out of the degassing chamber 104. A local center finding (LCF) device is to be used to align the content in the transfer chamber 106 (e.g., before entering a processing chamber 107, after leaving the processing chamber 107).

In some embodiments, the processing chambers 107 includes or more of etch chambers, deposition chambers (including atomic layer deposition, chemical vapor deposition, physical vapor deposition, or plasma enhanced versions thereof), anneal chambers, or the like.

Factory interface 101 includes a factory interface robot 111. Factory interface robot 111 includes a robot arm, such as a selective compliance assembly robot arm (SCARA) robot. Examples of a SCARA robot include a 2 link SCARA robot, a 3 link SCARA robot, a 4 link SCARA robot, and so on. The factory interface robot 111 includes an end effector on an end of the robot arm. The end effector is configured to pick up and handle specific objects, such as wafers. Alternatively, or additionally, the end effector is configured to handle objects such as a carrier and/or process kit rings (edge rings). The robot arm has one or more links or members (e.g., wrist member, upper arm member, forearm member, etc.) that are configured to be moved to move the end effector in different orientations and to different locations.

The factory interface robot 111 is configured to transfer objects between enclosure systems 130 (e.g., cassettes, FOUPs) and degassing chambers 104*a*, 104*b* (or load ports). While conventional systems are associated with misalignment of content or opening of (e.g., disassembly of, breaking the seal of, contaminating) a processing system 100 (e.g., factory interface 101) to align misaligned content, the processing system 100 is configured to facilitate alignment of content (e.g., via a set of one or more shelves of an enclosure system 130) without opening of (e.g., disassembly of, breaking the seal of, contaminating) the processing system 100 by an operator. Accordingly, in embodiments a sealed environment including an interior volume of an enclosure system 130 and an internal volume of the factory interface 101 are maintained during the alignment of content (e.g., via a set of one or more shelves of an enclosure system 130).

Transfer chamber 106 includes a transfer chamber robot 112. Transfer chamber robot 112 includes a robot arm with an end effector at an end of the robot arm. The end effector is configured to handle particular objects, such as wafers. In some embodiments, the transfer chamber robot 112 is a SCARA robot, but has fewer links and/or fewer degrees of freedom than the factory interface robot 111 in some embodiments.

A controller 109 controls various aspects of the processing system 100. The controller 109 is and/or includes a computing device such as a personal computer, a server computer, a programmable logic controller (PLC), a microcontroller, and so on. The controller 109 includes one or more processing devices, which, in some embodiments, are general-purpose processing devices such as a microprocessor, central processing unit, or the like. More particularly, in some embodiments, the processing device is a complex instruction set computing (CISC) microprocessor, reduced instruction set computing (RISC) microprocessor, very long instruction word (VLIW) microprocessor, or a processor implementing other instruction sets or processors implementing a combination of instruction sets. In some embodiments, the processing device is one or more special-purpose processing devices such as an application specific integrated circuit (ASIC), a field programmable gate array (FPGA), a digital signal processor (DSP), network processor, or the like. In some embodiments, the controller 109 includes a data storage device (e.g., one or more disk drives and/or solid state drives), a main memory, a static memory, a network interface, and/or other components. In some embodiments, the controller 109 executes instructions to perform any one or more of the methods or processes described herein. The instructions are stored on a computer readable storage medium, which include one or more of the main memory, static memory, secondary storage and/or processing device (during execution of the instructions). The controller 109 receives signals from and sends controls to factory interface robot 111 and wafer transfer chamber robot 112 in some embodiments.

FIG. 1 schematically illustrates transfer of content 110 (e.g., a process kit ring coupled to a process kit ring carrier) into a processing chamber 107. According to one aspect of the disclosure, content 110 is removed from an enclosure system 130 via factory interface robot 111 located in the factory interface 101. The factory interface robot 111 transfers the content 110 through one of the first vacuum ports

103*a*, 103*b* and into a respective degassing chamber 104*a*, 104*b*. A transfer chamber robot 112 located in the transfer chamber 106 removes the content 110 from one of the degassing chambers 104*a*, 104*b* through a second vacuum port 105*a* or 105*b*. The transfer chamber robot 112 moves the content 110 into the transfer chamber 106, where the content 110 is transferred to a processing chamber 107 though a respective port 108. While not shown for clarity in FIG. 1, transfer of the content 110 includes transfer of a process kit ring disposed on a process kit ring carrier, transfer of an empty process kit ring carrier, transfer of a placement validation wafer, etc.

FIG. 1 illustrates one example of transfer of content 110, however, other examples are also contemplated. In some examples, it is contemplated that the enclosure system 130 is coupled to the transfer chamber 106 (e.g., via a load port mounted to the transfer chamber 106). From the transfer chamber 106, the content 110 is to be loaded into a processing chamber 107 by the transfer chamber robot 112. Additionally, in some embodiments, content 110 is loaded in a substrate support pedestal (SSP). In some embodiments, an additional SSP is positioned in communication with the factory interface 101 opposite the illustrated SSP. Processed content 110 (e.g., a used process kit ring) is to be removed from the processing system 100 in reverse of any manner described herein. When utilizing multiple enclosure systems 130 or a combination of enclosure system 130 and SSP, in some embodiments, one SSP or enclosure system 130 is to be used for unprocessed content 110 (e.g., new process kit rings), while another SSP or enclosure system 130 is to be used for receiving processed content 110 (e.g., used process kit rings). The enclosure system 130 is used to align content 110 (e.g., via a set of one or more shelves in the enclosure system 130) prior to transfer of content 110 via the robot arm and/or prior to transfer of the enclosure system 130. The set of one or more shelves aligning the content 110 enable the robot arm to correctly remove content 110 from specific locations the enclosure system 130, enable the content 110 to be properly secured in the enclosure system 130 (e.g., enable the set of one or more shelves to secure the content 110), and enable the enclosure system 130 to properly transport content 110.

The processing system 100 includes chambers, such as factory interface 101 (e.g., equipment front end module (EFEM)) and adjacent chambers (e.g., load port 128, enclosure system 130, SSP, degassing chamber 104 such as a loadlock, or the like) that are adjacent to the factory interface 101. One or more of the chambers is sealed (e.g., each of the chambers is sealed). The adjacent chambers are sealed to the factory interface 101. In some embodiments, inert gas (e.g., one or more of nitrogen, argon, neon, helium, krypton, or xenon) is provided into one or more of the chambers (e.g., the factory interface 101 and/or adjacent chambers) to provide one or more inert environments. In some examples, the factory interface 101 is an inert EFEM that maintains the inert environment (e.g., inert EFEM minienvironment) within the factory interface 101 so that users do not need to enter the factory interface 101 (e.g., the processing system 100 is configured for no manual access within the factory interface 101).

In some embodiments, gas flow (e.g., inert gas, nitrogen) is provided into one or more chambers (e.g., factory interface 101) of the processing system 100. In some embodiments, the gas flow is greater than leakage through the one or more chambers to maintain a positive pressure within the one or more chambers. In some embodiments, the inert gas within the factory interface 101 is recirculated. In some embodiments, a portion of the inert gas is exhausted. In some embodiments, the gas flow of non-recirculated gas into the factory interface 101 is greater than the exhausted gas flow and the gas leakage to maintain a positive pressure of inert gas within the factory interface 101. In some embodiments, the factory interface 101 is coupled to one or more valves and/or pumps to provide the gas flow into and out of the factory interface 101. A processing device (e.g., of controller 109) controls the gas flow into and out of the factory interface 101. In some embodiments, the processing device receives sensor data from one or more sensors (e.g., oxygen sensor, moisture sensor, motion sensor, door actuation sensor, temperature sensor, pressure sensor, etc.) and determines, based on the sensor data, the flow rate of inert gas flowing into and/or out of the factory interface 101.

The enclosure system 130 allows for aligning of content 110 (e.g., carrier, process kit ring, or the like) without opening the sealed environment within the factory interface 101 and adjacent chambers. The enclosure system 130 seals to the load port 128 responsive to being docked on the load port 128. The enclosure system 130 provides purge port access so that the interior of the enclosure system 130 can be purged prior to opening the enclosure system 130 to minimize disturbance of the inert environment within the factory interface 101.

Figure 2:
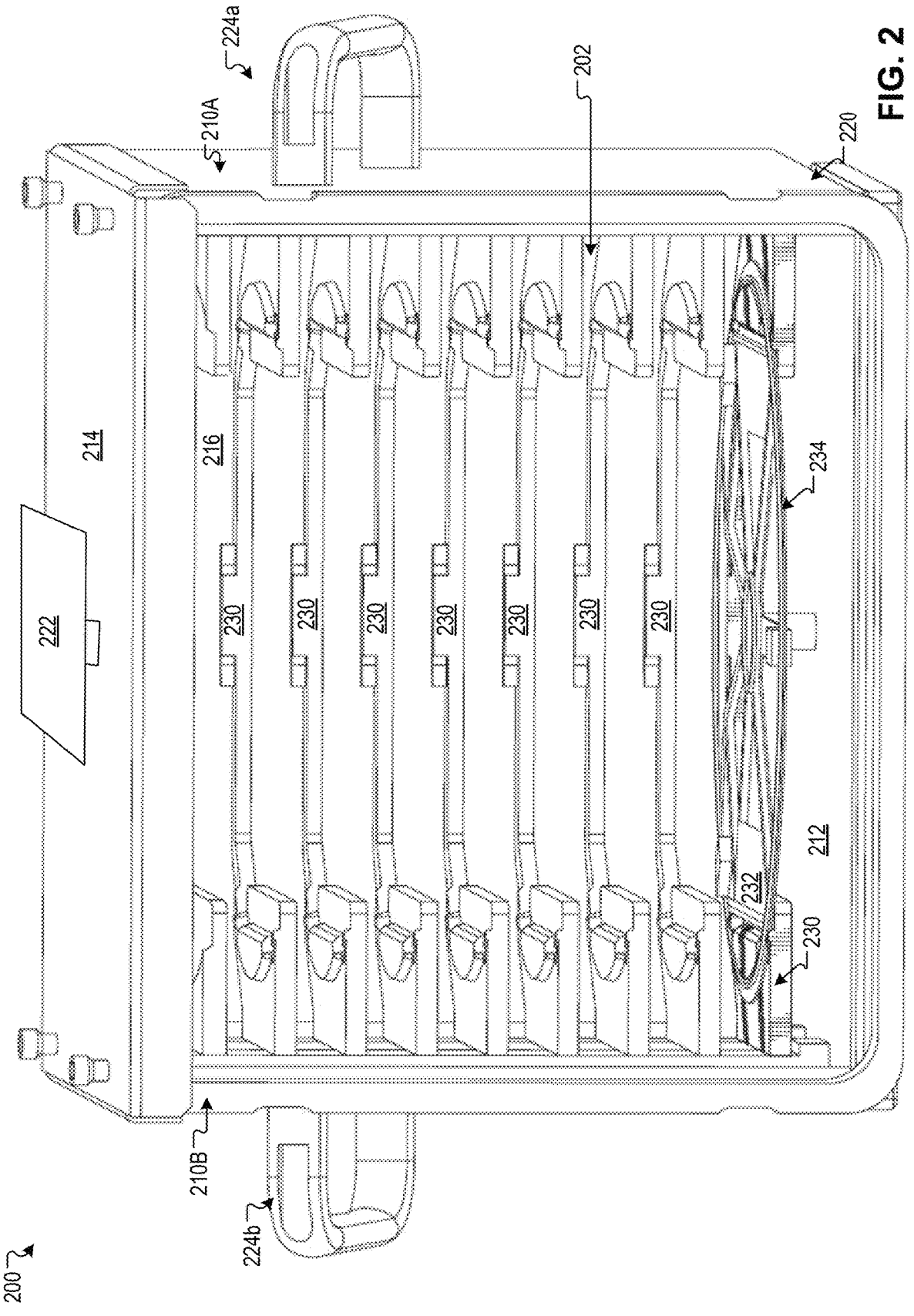
FIG. 2 illustrates a front view of an enclosure system, according to certain embodiments.

FIG. 2 illustrates a front perspective view of an enclosure system 200 (e.g., enclosure system 130 of FIG. 1), according to certain embodiments. The enclosure system 200 includes one or more shelves 230 that are configured to align content, such as a carrier and/or a process kit ring. As shown in FIG. 2, in some embodiments, shelf 230 may have a left portion to support a first distal end of content, a right portion to support a second distal end of content, and a middle portion connecting the left portion and the right portion. In some embodiments, shelf 230 may be two or more distinct components (e.g., remote from each other, not connected to each other, not integral to each other, etc.), such as a left shelf and a right shelf that are not connected to each other.

The enclosure system 200 includes surfaces (e.g., walls, sidewalls, substantially planar structures, etc.) that at least partially enclose an interior volume 202 (e.g., form a cavity or chamber). In some embodiments, the interior volume 202 is a mini environment (e.g., sealed environment). In some embodiments, the interior volume 202 is kept substantially particle free (e.g., substantially uncontaminated). In some embodiments, the enclosure system 200 includes a fan (e.g., at the top surface) that suppresses any particles in the interior volume 202. In some embodiments, the interior volume is substantially devoid (or completely devoid) of one or more of moisture, oxygen, particles (e.g., dust), or the like.

The surfaces include sidewall surfaces 210A-B (e.g., sidewalls), bottom surface 212 (e.g., bottom wall), top surface 214 (e.g., top wall), and rear surface 216 (e.g., rear wall). In some embodiments, the surfaces form a clampable tub. One or more of the surfaces (e.g., sidewall surfaces 210A-B, bottom surface 212, top surface 214, etc.) form a front interface. The front interface is configured to interface with (e.g., seal to) a door for transportation of the enclosure system 200 (e.g., and to provide a sealed environment). The front interface is configured to interface (e.g., seal to) a substantially vertical portion of a load port of a wafer processing system. Responsive to the front interface being sealed to a door or the load port, the enclosure system 200 creates a sealed environment (e.g., gases and/or particles do not leave or enter the enclosure system 200 from the surrounding environment outside of the wafer processing system).

In some embodiments, the enclosure system 200 includes a baseplate 220 (e.g., adaptor plate) coupled to the bottom surface 212. The baseplate 220 is configured to interface with a horizontal portion of the load port. The baseplate 220 has features (e.g., recesses, receptacles, kinematic interface) to receive kinematic devices (e.g., kinematic pins, precision located pins) of the horizontal portion of the load port. In some embodiments the baseplate 220 is secured to the bottom surface 212 prior to interfacing the enclosure system 200 with the load port. In some embodiments, the baseplate 220 is secured to the load port and then the bottom surface 212 is secured to the baseplate 220. In some embodiments, the enclosure system 200 has a seal (e.g., crushable seal, gasket) to seal one or more openings in the bottom surface 212.

In some embodiments, one or more of an overhead transport flange 222 or at least one handle 224 is coupled to one or more surfaces of the enclosure system 200 for transport (e.g., automated transport, manual transport, etc.) of the enclosure system 200. In some embodiments, the overhead transfer (OHT) flange 222 is coupled to the top surface 214. In some embodiments, the first handle 224A is disposed on a first sidewall surface 210A and a second handle 224B is disposed on a second sidewall surface 210B.

In some embodiments, one or more purge adaptors are disposed in the bottom surface 212 (e.g., inserted into openings formed in the bottom surface 212). The purge adaptors are used to one or more of fill the enclosure system 200 with a gas (e.g., Nitrogen ($N_2$)), remove gas from the enclosure system, pass a gas through the enclosure system 200, or the like. The purge adaptors extend through the baseplate 220 to fluidly couple with one or more of a gas or vacuum line (e.g., for purging the enclosure system 200, for creating a vacuum in the enclosure system 200, for filling the enclosure system 200 with a gas, etc.). Each of the purge adaptors provides a seal at a corresponding opening in the bottom surface 212 (e.g., to provide a sealed environment). In some embodiments, the enclosure system 200 seals to the load port responsive to being docked to the load port. The interior volume of the enclosure system 200 is configured to be purged via the one or more purge adaptors prior to opening of the enclosure system 200.

In some embodiments, one or more shelves 230 are at least partially disposed within the interior volume 202. In some embodiments, one or more shelves 230 are completely disposed within the interior volume 202. In some embodiments, the one or more shelves 230 are attached to sidewall surfaces 210A-B. In some embodiments, the one or more shelves 230 are attached to one or more support structures (e.g., posts, etc.) that are attached to the enclosure system 200 (e.g., sidewall surfaces 210A-B, bottom surface 212, baseplate 220, or the like).

A set of one or more shelves 230 is configured to receive content, such as a carrier 232 and/or a process kit ring 234. In some embodiments, the carrier 232 is disposed on a set of one or more shelves 230 and the process kit ring is disposed above (e.g., contacting, not contacting) the carrier 232 on the shelf 230. In some embodiments, the carrier 232 is disposed on a set of one or more shelves 230 and the process kit ring is disposed on the carrier 232 above the set of one or more shelves 230 (e.g., without contacting the set of one or more shelves).

The set of one or more shelves 230 has alignment features and/or surfaces that are configured to align the content on the set of one or more shelves 230. If a robot arm places content on a set of one or more shelves 230 in an incorrect position, the alignment features and/or surfaces align the content into a correct position. In some embodiments, the set of one or more shelves 230 has one or more retaining devices configured to secure the content to at least one shelf 230 of the set of one or more shelves 230.

Figure 3A:
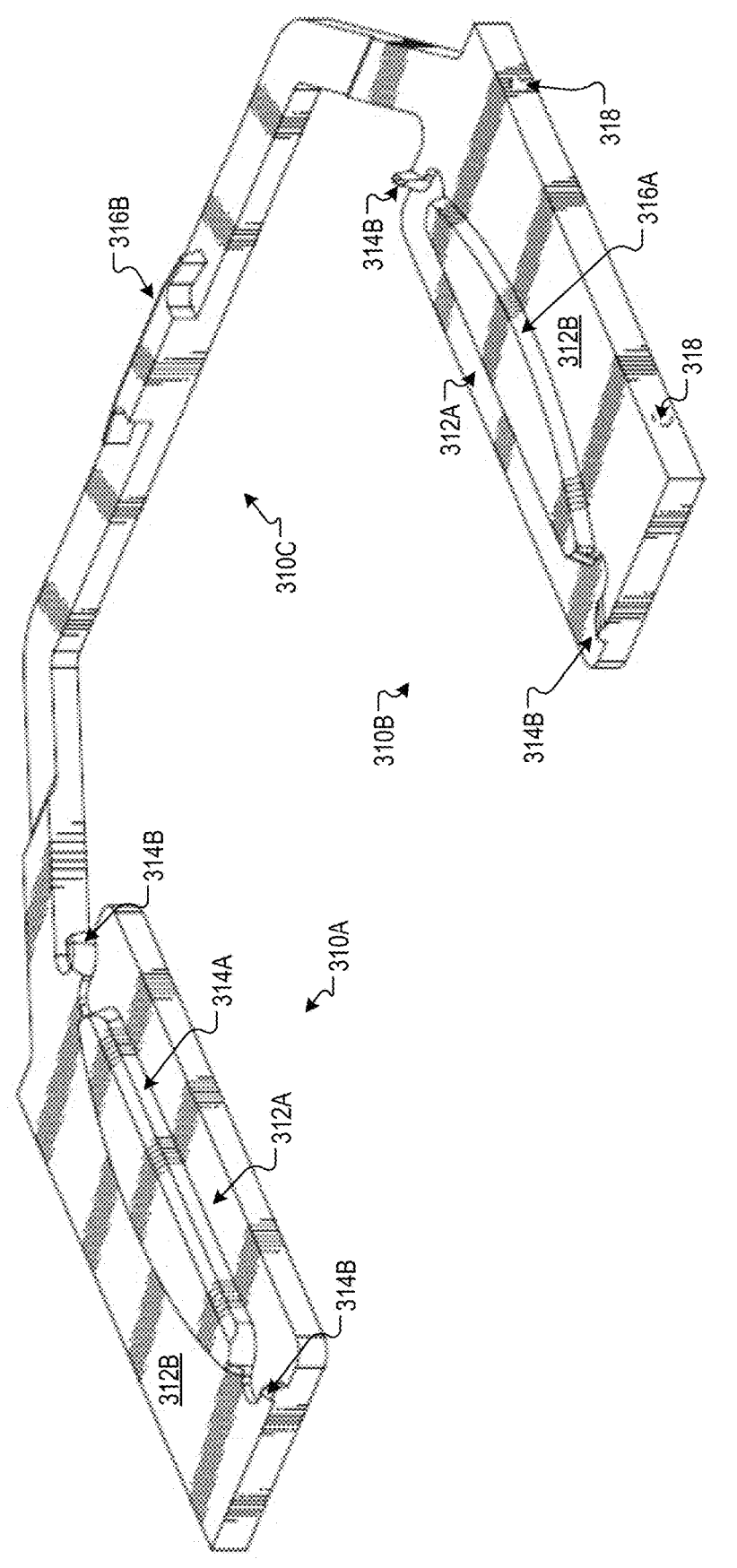
Figures 3B, 3C, 3D, 3E:
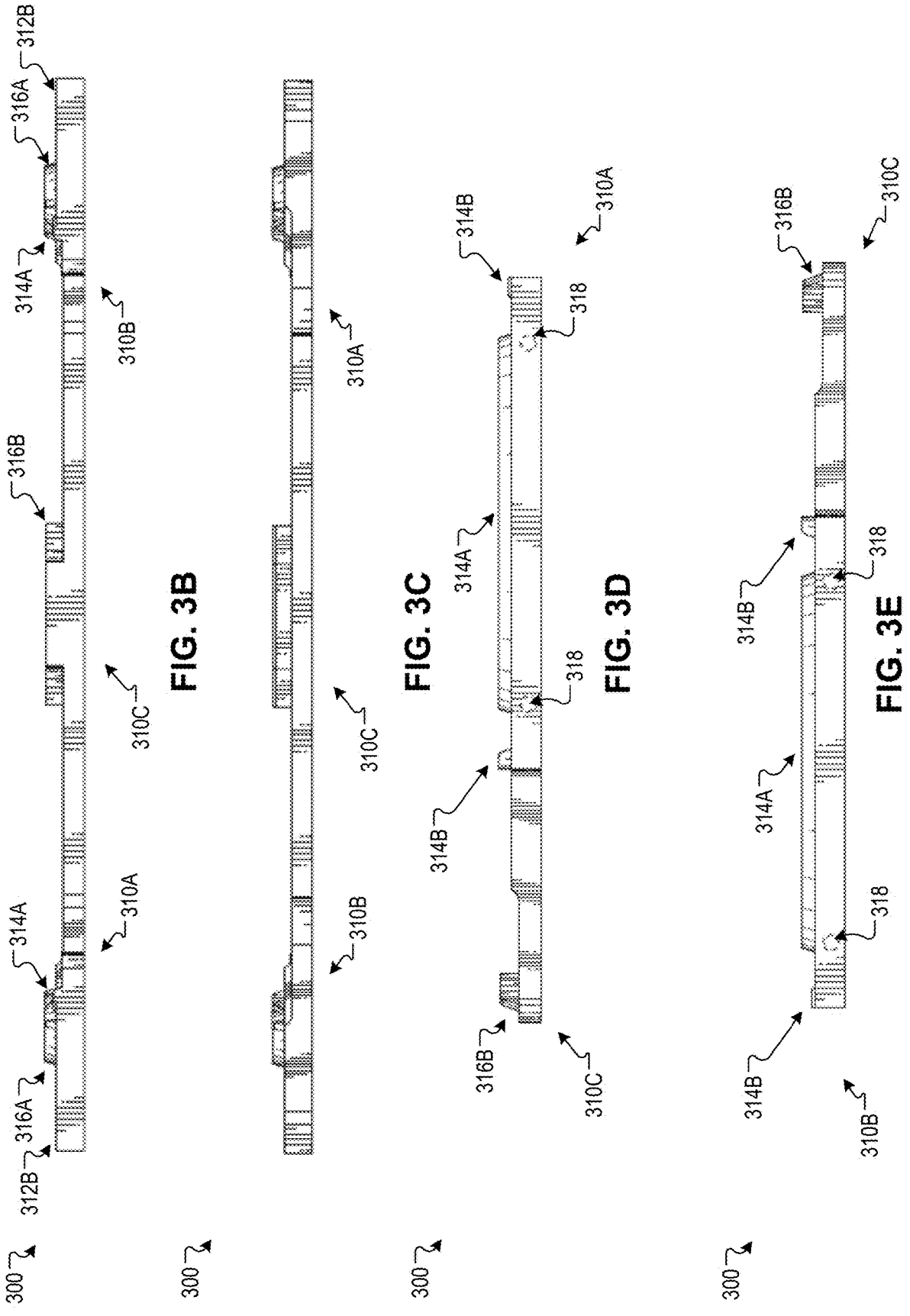
Figures 3F, 3G:
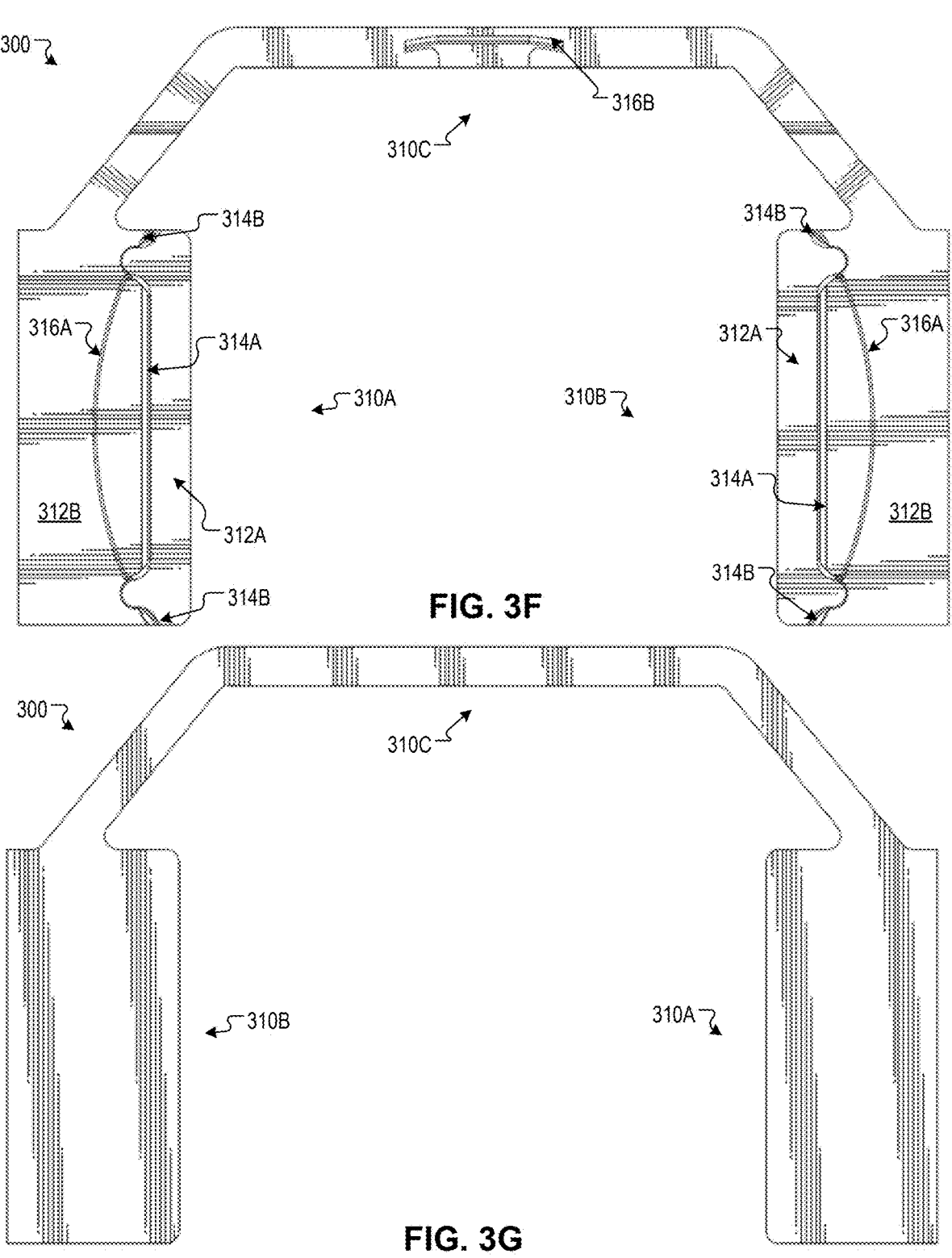
Figure 3H:
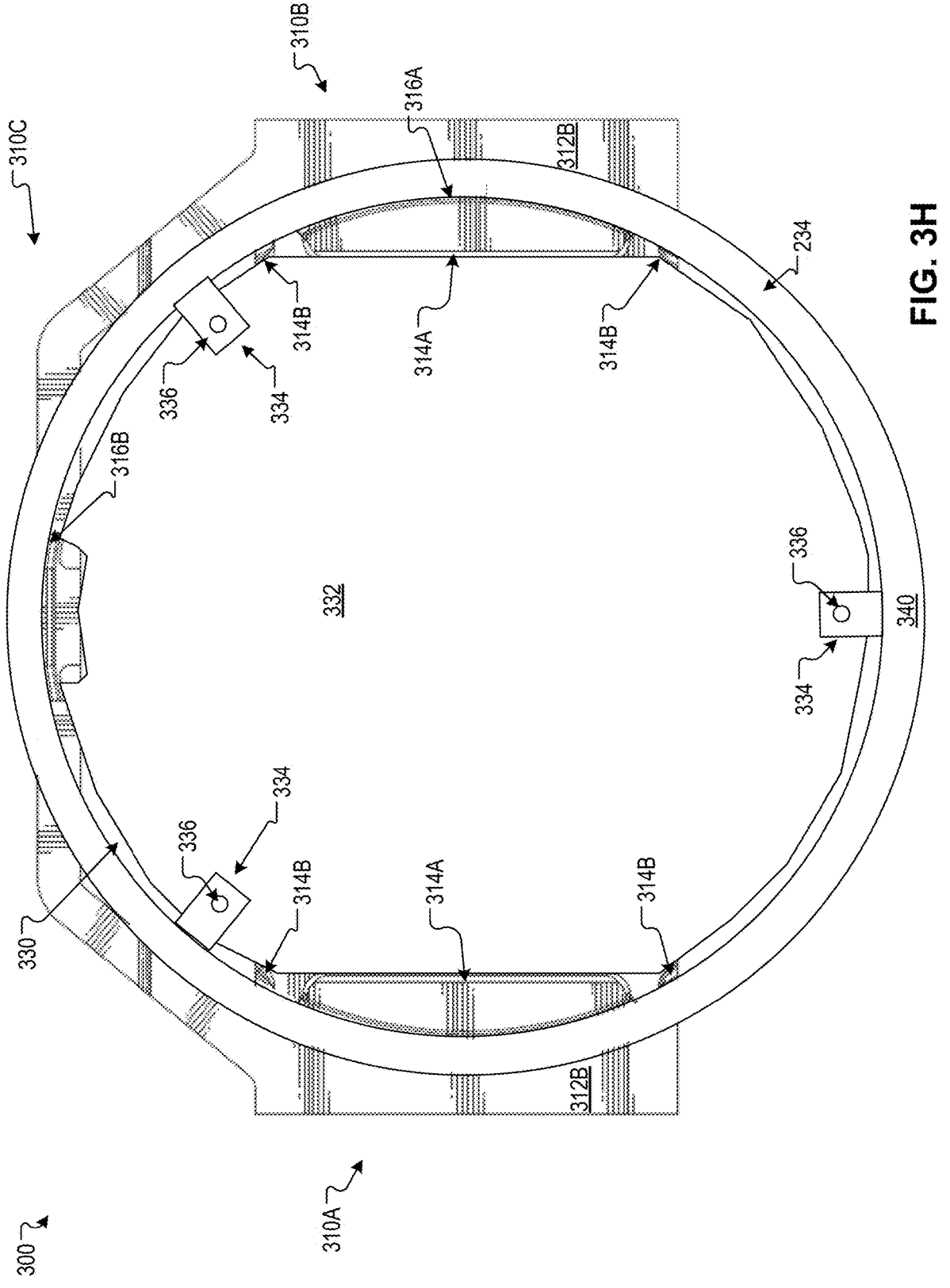

FIGS. 3A-J illustrates a shelf 300 (e.g., set of one or more shelves or a single shelf) of an enclosure system (e.g., FOUP of a wafer processing system), according to certain embodiments. Shelf 300 corresponds to shelf 230 of FIG. 2 in some embodiments. FIG. 3A illustrates a perspective view of the shelf 300, according to certain embodiments. FIG. 3B illustrates a front view of the shelf 300, according to certain embodiments. FIG. 3C illustrates a rear view of the shelf 300, according to certain embodiments. FIG. 3D illustrates a left view of the shelf 300, according to certain embodiments. FIG. 3E illustrates a right view of the shelf 300, according to certain embodiments. FIG. 3F illustrates a top view of the shelf 300, according to certain embodiments. FIG. 3G illustrates a bottom view of the shelf 300, according to certain embodiments. FIG. 3H illustrates a top view of the shelf 300 supporting a carrier 330 and a process kit ring 340, according to certain embodiments. FIG. 3I-J illustrate cross-sectional side views of the shelf 300 supporting a carrier 330 and a process kit ring 340, according to certain embodiments.

The shelf 300 includes a first portion 310A and a second portion 310B. In some embodiments, the first portion 310A and the second portion 310B are mirror images of each other. In some embodiments, the first portion 310A and the second portion 310B are joined by a third portion 310C. In some embodiments, the first, second, and third portions 310A-C of the carrier form a "U"-shape, where the first portion 310A is a first side, the second portion 310B is a second side, and the third portion 310C is a rear side that is disposed between the first and second sides. In some embodiments, the first, second, and third portions 310A-C of the shelf 300 are integral to each other. In some embodiments, two or more of the first, second, and third portions 310A-C of the shelf 300 are attached to each other (e.g., via one or more fasteners, via adhesive, via soldering, via welding, etc.). In some embodiments, two or more of the first, second, and third portions 310A-C of the shelf 300 are remote from each other (e.g., not attached, not connected, etc.). In some embodiments, first portion 310A is a first shelf and second portion 310B is a second shelf, where the first and second shelf are coplanar and not connected to each other (e.g., without a third portion 310C).

The first portion 310A and second portion 310B include a first upper surface 312A in a first plane, a second upper surface 312B in a second plane above the first plane, first carrier alignment features 314A, and process kit ring alignment features 316A. In some embodiments, the first portion 310A and the second portion 310B further include second carrier alignment features 314B. In some embodiments, the first portion 310A and the second portion further include attachment features 318 (e.g., opening to receive a fastener, a fastener, etc.) configured to attach the shelf 300 to the enclosure system.

In some embodiments, the shelf further includes a third portion disposed between the first and second portions 310A-B. The third portion 310C includes a process kit ring alignment feature 316B.

The carrier alignment features 314 are configured to align a carrier on (e.g., contacting, disposed above) the first upper surfaces 312A. The process kit ring alignment features 316 are configured to align a process kit ring on the carrier, where the process kit ring is disposed above the second upper surfaces 312B. In some embodiments, a carrier is supported by the first portion 310A and the second portion 310B and a process kit ring is disposed on the carrier without contacting the first portion 310A and the second portion 310B (e.g., without contacting one or more shelves 300). In some embodiments, the process kit ring contacts the first portion 310A and/or second portion 310B responsive to movement (e.g., jostling, shaking, impact, rapid movement, etc.) and the process kit alignment features 316 re-align the process kit ring on the carrier.

One or more of the carrier alignment features 314 and/or process kit ring alignment features 316 include a corresponding sidewall. In some embodiments, a sidewall of a carrier alignment feature 314 and/or a process kit ring alignment feature 316 is at about a 100 to 110 degree angle from the first plane. In some embodiments, a sidewall of a carrier alignment feature 314 and/or a process kit ring alignment feature 316 includes a lower portion that is at about a 100 to 110 degree angle from the first plane and an upper portion that is at about a 130 to 140 degree angle from the first plane.

In some embodiments, the carrier alignment features 314A include first sidewalls that are configured to prevent x-direction movement and yaw movement of the carrier. In some embodiments, the carrier alignment features 314B first include second sidewalls that are configured to prevent y-direction movement of the carrier. In some embodiments, the first upper surfaces 312A are configured to prevent z-direction movement, pitch movement, and roll movement of the carrier.

In some embodiments, the process kit ring alignment features 316A include sidewalls that are configured to prevent yaw movement of the process kit ring. In some embodiments, the sidewalls have about a 100 to 110 degree angle from the first plane. In some embodiments, the carrier is configured to prevent x-direction movement, y-direction movement, z-direction movement, pitch movement, and roll movement of the process kit ring (e.g., without the process kit ring contacting the first portion 310A or the second portion 310B).

Referring to FIG. 3H, the shelf 300 is configured to support a carrier 330 and/or a process kit ring 340. The carrier 330 includes a rigid body 332 forming openings, fasteners 336 configured to removably attach to the rigid body 332 via the plurality of openings, and fingers 334 configured to be removably attached to the rigid body via the fasteners 336 and the openings. The fingers 334 are configured to support content (e.g., process kit ring 340) during transportation of the carrier 330 within a substrate processing system. In some embodiments, the process kit ring 340 is contacting the carrier 330 when the process kit ring 340 is disposed on the carrier 330. In some embodiments, the process kit ring 340 is disposed above the carrier 330 without contacting the carrier 330 when the process kit ring 340 is disposed on the carrier 330. In some embodiments, the process kit ring 340 is disposed above the shelf 300 without contacting the shelf 300 when the process kit ring 340 is disposed on the carrier 330 and the carrier is disposed on the shelf 300.

Referring to FIG. 3I, the shelf 300 (e.g., set of one or more shelves or a single shelf) is configured to support a carrier 330 and/or a process kit ring 340. The process kit ring alignment feature 316B is configured to align the process kit ring 340 on the carrier 330 (e.g., above the shelf or set of shelves). The fingers 334 are attached to the rigid body 332 of the carrier 330 via fasteners 336. In some embodiments, the fingers 334 support the process kit ring 340 while the carrier 330 (e.g., supporting the process kit ring 340) is disposed on the shelf 300.

Referring to FIG. 3J, the shelf 300 is configured to align a carrier 330 and/or a process kit ring 340 on the shelf 300. The shelf includes carrier alignment features 314 and process kit ring alignment features 316. The carrier alignment features 314 include one or more sidewalls and the process kit ring alignment features 316 include one or more sidewalls.

In some embodiments, a sidewall (e.g., of carrier alignment feature 314A) of the shelf 300 has one or more facets or is curved. In some embodiments, a sidewall (e.g., of carrier alignment feature 314A) of the shelf 300 is about a 100 to 150 degree angle, about 120 to 150 degree angle, or about 130-140 degree angle from the first upper surface 312A. In some embodiments, a sidewall (e.g., of carrier alignment feature 314A) includes a lower portion that is about a 100 to 110 degree angle (e.g., about 15 degrees from orthogonal) from the first upper surface 312A and an upper portion that is at about a 130 to 140 degree angle (e.g., about 45 degrees from orthogonal, about 30 degrees more than the lower portion) from the first upper surface 312A.

In some embodiments, a sidewall (e.g., of process kit ring alignment feature 316A) is about a 90 to 150 degree angle, 100 to 150 degree angle, or 100 to 110 degree angle (e.g., about 15 degrees from orthogonal) from the second upper surface 312B.

In some embodiments, the sidewalls of the carrier alignment features 314 and/or the process kit ring alignment feature 316 provide a capturing ramp to allow for a misaligned process kit ring and/or carrier returning from the substrate processing system (e.g., from a tool) to be aligned and restrained upon being lowered onto the shelf 300. Proper alignment of the process kit ring to the carrier is used to properly orient and place the process kit ring in a processing chamber. Conventionally systems have improper alignment of the process kit to the carrier which causes a misplacement or dropping of the carrier and process kit ring in the tool. In some instances, a process kit ring removed from a processing chamber returns to the enclosure system misaligned (e.g., due to error of the robot arm, the LCF device, the aligner device, etc.). The shelf 300 aligns process kit rings and carriers that return from the substrate processing system misaligned. In some embodiments, the shelf 300 restrains the process kit ring and/or carrier for transportation (e.g., on OHT via tool automation).

In some embodiments, all alignment features (e.g., carrier alignment features 314 and/or the process kit ring alignment feature 316) are created from a single piece of material and capturing ramps (e.g., sidewalls of the alignment features) are used to align misaligned returning content. In some embodiments, self-actuating hooks (e.g., retaining devices) are used to secure the content and are locked by tool automation. In some embodiments, the shelf 300 provides for separation of the process kit ring from the carrier to allow for realignment of both via automation.

In some embodiments, the shelf 300 is made from plastic polyethylene terephthalate (PET). In some embodiments, shelf 300 is a single comb spanning one station (e.g., a single shelf supporting a process kit ring and a carrier from a left side of the enclosure system and the right side of the enclosure system) instead of separate combs per side. Using a single shelf 300 to support a process kit ring and a carrier on two sides reduces tolerance stack.

Figures 4A, 4B:
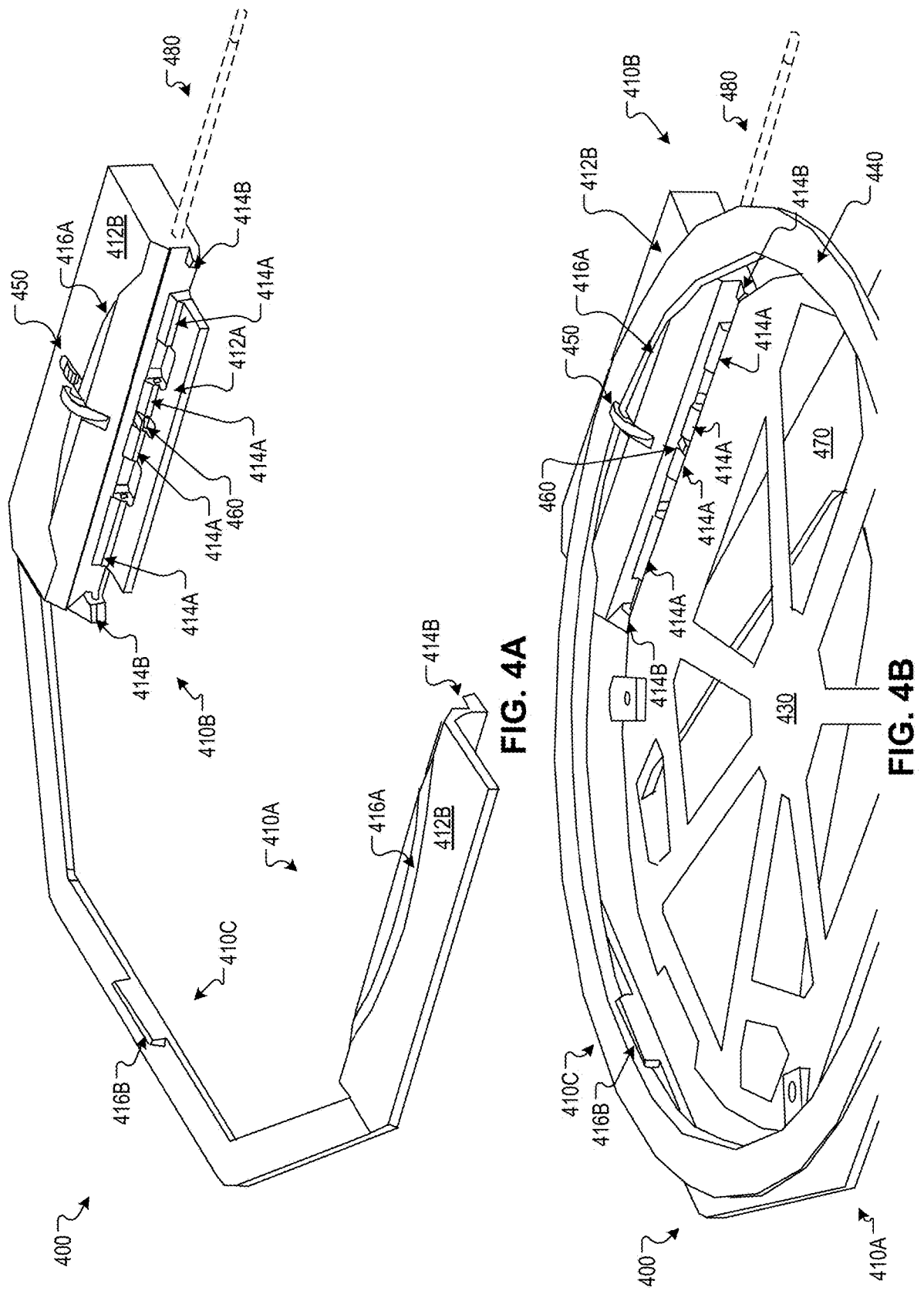
FIGS. 4A-E illustrate a shelf with retaining devices, according to certain embodiments.

In some embodiments, the material from which a shelf 300 is formed is secured (e.g., fixture by four screw holes)

and then machined while being secured. In some embodiments, windows (e.g., openings) are cut into the shelf 300 to reduce weight (e.g., see carrier 430 of FIG. 4B).

In some embodiments, process kit ring alignment feature 316B is used for process kit ring alignment, second upper surfaces 312B are used for process kit ring centering, and a process kit ring retaining device (e.g., see FIGS. 4A-E) is used for process kit ring restraint. In some embodiments, carrier alignment features 314A-B are used for carrier alignment and a carrier retaining device (e.g., see FIGS. 4A-E) is used for carrier restraint.

In some embodiments, the six degrees of freedom of the carrier 330 and process kit ring 340 are controlled by the robot arm. In transferring the carrier 330 and process kit ring 340 to the shelf 300, the robot arm transfers the six degrees of freedom of control to the shelf 300. In some instances, as the six degrees of freedom are transferred, each degree of freedom is not transferred at the same time which conventionally leads to misalignment of the carrier 330 and the process kit ring 340. In some instances, the robot arm and the shelf are in planes that are not completely parallel which conventionally leads to misalignment of the carrier 330 and the process kit ring 340. The aligning features (e.g., carrier aligning features 314 and process kit ring aligning features 316) aligns misaligned carriers 330 and process kit rings 340.

FIGS. 4A-E illustrate a shelf 400 (e.g., shelf 230 of FIG. 2, shelf 300 of FIGS. 3A-J) with retaining devices, according to certain embodiments. In some embodiments, features in FIGS. 4A-E have similar or the same functionality as features with similar numbering in FIGS. 3A-J.

The shelf 400 includes a first portion 410A (e.g., first portion 310A of FIGS. 3A-J), a second portion 410B (e.g., second portion 310B of FIGS. 3A-J), and a third portion 410C (e.g., third portion 310C of FIGS. 3A-J). The first portion 410A and/or the second portion 410B includes a first upper surface 412A (e.g., first upper surface 312A of FIGS. 3A-J), a second upper surface 412B (e.g., second upper surface 312B of FIGS. 3A-J), one or more carrier alignment features 414A (e.g., carrier alignment features 314A of FIGS. 3A-J), one or more carrier alignment features 414B (e.g., carrier alignment features 314B of FIGS. 3A-J), one or more process kit ring alignment features 416A (e.g., first process kit ring alignment features 316A of FIGS. 3A-J), and process kit ring alignment feature 416B (e.g., process kit ring alignment feature 316B of FIGS. 3A-J). In some embodiments, shelf 400 is a set of one or more shelves. In some embodiments, first portion 410A is a first shelf and second portion 410B is a second shelf, where the first shelf and the second shelf are remote from each other (e.g., not connected to each other, not attached to each other, etc.).

In some embodiments, the shelf 400 includes one or more carrier retaining devices 460 (e.g., self-actuating hook to secure the carrier 430) and/or process kit ring retaining devices 450 (e.g., self-actuating hook to secure the process kit ring 440). Upon lowering a carrier 430 (e.g., carrier 330 of FIGS. 3H-J) supporting a process kit ring 440 (e.g., process kit ring 340 of FIGS. 3H-J) (e.g., via a robot arm 470), the process kit ring 440 engages with (e.g., pushes down) a first end portion of a process kit ring retaining device 450, causing a second end portion of the process kit ring retaining device 450 to retain the process kit ring 440. In some examples, lowering the process kit ring 440 onto the first end portion of the process kit ring retaining device 450 rotates the process kit ring retaining device so that the first end portion is pushed into the shelf 400 (e.g., to be substantially parallel with the second upper surface 412B) and the second end portion is rotated to a position above at least a portion of the process kit ring 440.

Upon lowering the carrier 430 onto the first upper surface 312A, the carrier 430 engages with (e.g., pushes down) a first end portion of a carrier retaining device 460, causing a second end portion of the carrier retaining device 460 to retain the carrier 430. In some examples, lowering the carrier 430 onto the first end portion of the carrier retaining device 460 rotates the carrier retaining device 460 so that the first end portion is pushed into the shelf 400 (e.g., to be substantially parallel with the first upper surface 412A) and the second end portion is rotated to a position above at least a portion of the carrier 430.

Figures 4C, 4D, 4E:
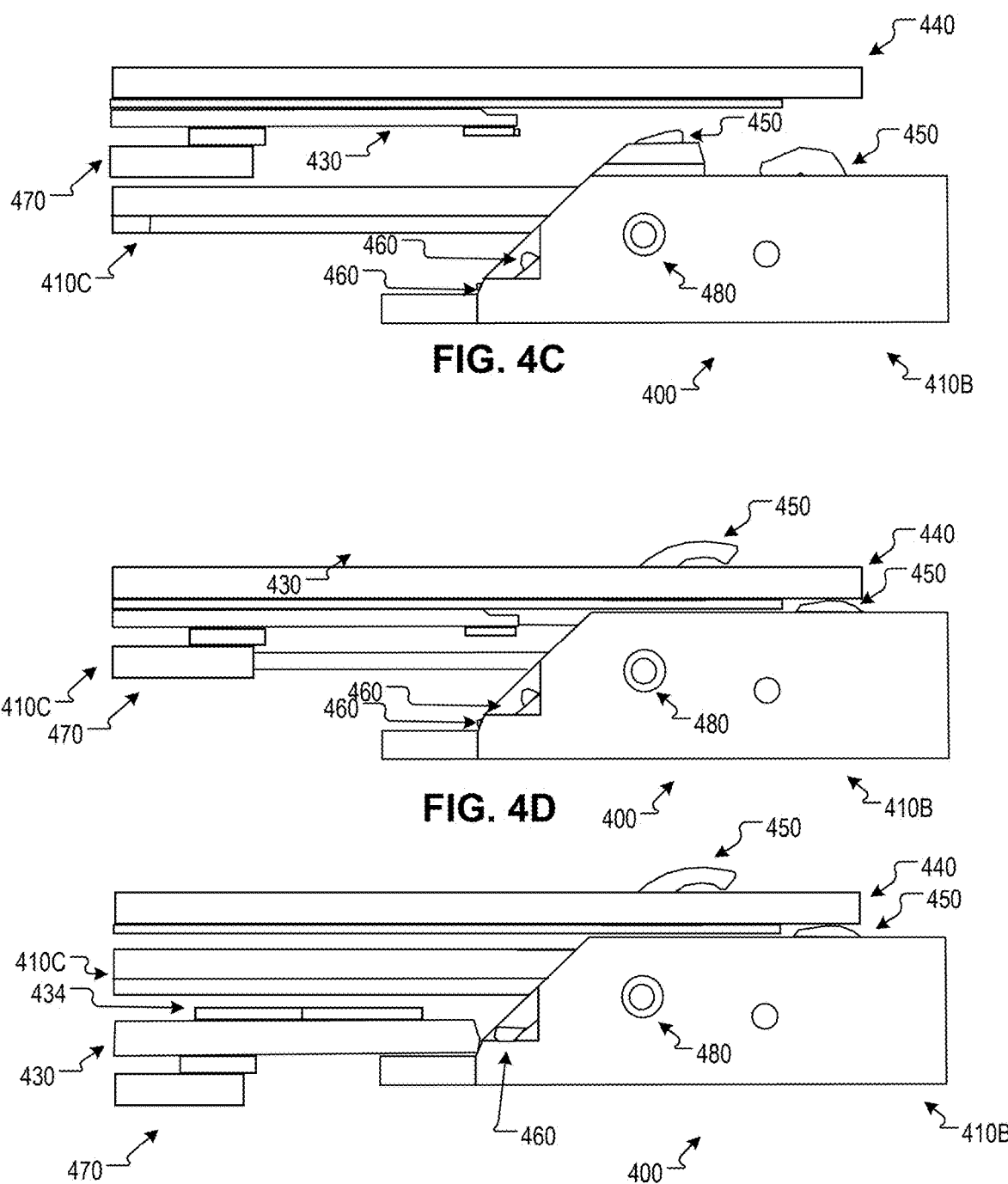

Referring to FIG. 4C, a robot arm 470 is positioned above the shelf 300. A carrier 430 supporting a process kit ring 440 is disposed on the robot arm 470.

Referring to FIG. 4D, the robot arm 470 lowers the carrier 430 supporting the process kit ring 440 so that the process kit ring 440 actuates a first distal portion of the process kit ring retaining device 450 (e.g., self-actuating hook) which causes the second distal portion of the process kit ring retaining device 450 to be disposed above the process kit ring 440 to retain the process kit ring 440 on the shelf 400.

Referring to FIG. 4E, the robot arm 470 lowers the carrier 430 so that the carrier 430 actuates a first distal portion of the carrier retaining device 460 (e.g., self-actuating hook) which causes the second distal portion of the carrier retaining device 460 to be disposed above the carrier 430 to retain the carrier 430 on the shelf 400.

Referring to FIGS. 4A-E, in some embodiments, the shelf 400 further includes a locking device 480. In some embodiments, the locking device 480 locks the carrier retaining device 460 and/or the process kit ring retaining device 450 into a secured position. In some embodiments, closing of a door of the enclosure system (e.g., closing the FOUP door) actuates the locking device 480 to lock the carrier retaining device 460 and the process kit ring retaining device 450 into the secured position (e.g., for transportation of the enclosure system).

In some embodiments, first portion 410A includes one or more of a carrier retaining device 460, a process kit ring retaining device 450, and/or locking device 480. In some embodiments, second portion 410B includes one or more of a carrier retaining device 460, a process kit ring retaining device 450, and/or locking device 480. In some embodiments, first portion 410A and second portion 410B both include one or more of a carrier retaining device 460, a process kit ring retaining device 450, and/or locking device 480.

Figure 5:
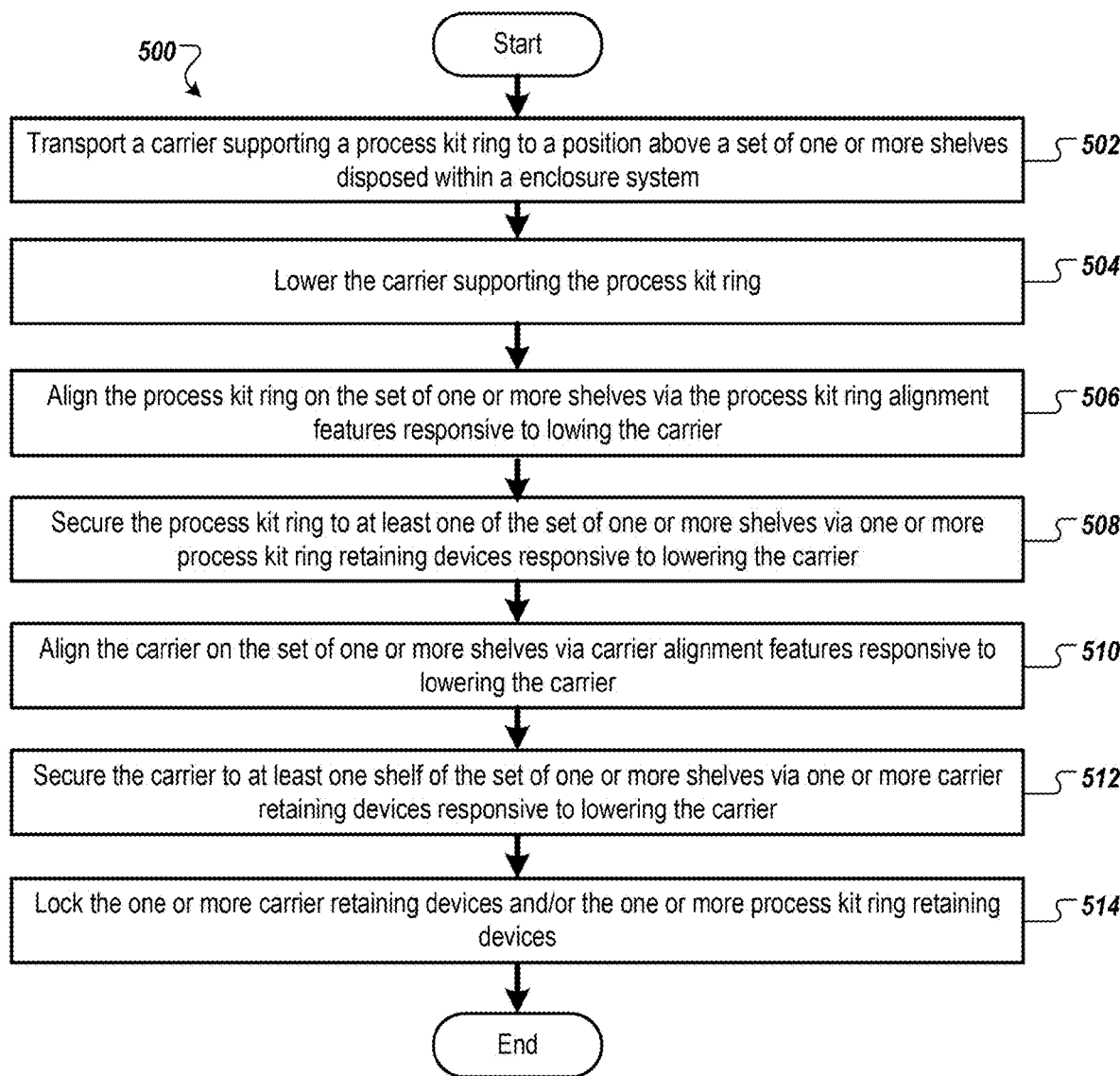
FIG. 5 illustrates a method of using one or more shelves of an enclosure system, according to certain embodiments.

FIG. 5 illustrates a method 500 of using one or more shelves of an enclosure system, according to certain embodiments. In some embodiments, one or more of operations of method 500 are performed by a robot arm (e.g., robot arm of factory interface robot 111 of FIG. 1, robot arm 470 of FIGS. 4B-E) and/or by a controller (e.g., controller 109 of FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment.

Referring to method 500 of FIG. 5, at block 502, a carrier supporting a process kit ring is transported (e.g., by a robot arm) to a position above a set of one or more shelves disposed within an enclosure system.

At block 504, the carrier supporting the process kit ring is lowered (e.g., by the robot arm).

In some embodiments, at block 506, the process kit ring is aligned on the set of one or more shelves and/or the carrier via process kit ring alignment features responsive to lowing of the carrier. In some embodiments, the process kit ring alignment features include sloped sidewalls that guide the process kit ring into an aligned orientation.

In some embodiments, at block 508, the process kit ring is secured to the set of one or more shelves via a process kit ring retaining device responsive to lowering the carrier. As the material (e.g., carrier and process skit ring) moves down, the weight of the process kit ring actuates the process kit ring retaining device (e.g., process kit (PK) restraint).

At block 510, the carrier is aligned on the set of one or more shelves via carrier alignment features responsive to lowing of the carrier. In some embodiments, the carrier alignment features include sloped sidewalls that guide the carrier into an aligned orientation.

At block 512, the carrier is secured to the set of one or more shelves via a carrier retaining device responsive to lowering the carrier. As the carrier is deposited into position, the weight of the carrier actuates the carrier retaining device (e.g., the carrier restraint).

At block 514, the carrier retaining device and/or the process kit ring retaining device are locked (e.g., responsive to closing a door of the enclosure system which actuates a locking device). In some embodiments, a FOUP door actuates the locking device to lock both the PK restraint and the carrier restraint. In some embodiments, as the process kit ring and the carrier are lowered, the process kit ring and the carrier are separated by the set of one or more shelves. This allows the capture and alignment of both the carrier and the process kit ring from any misalignment introduced by automation during process kit ring removal. In some embodiments, as the process kit ring and the carrier (e.g., process kit ring disposed on the carrier) are lowered, the carrier contacts the set of one or more shelves and the process kit ring does not contact the set of one or more shelves.

In some embodiments, each of the operations of method 500 are performed while maintaining a sealed environment (e.g., without opening the factory interface, without opening the enclosure system).

Figure 6A:
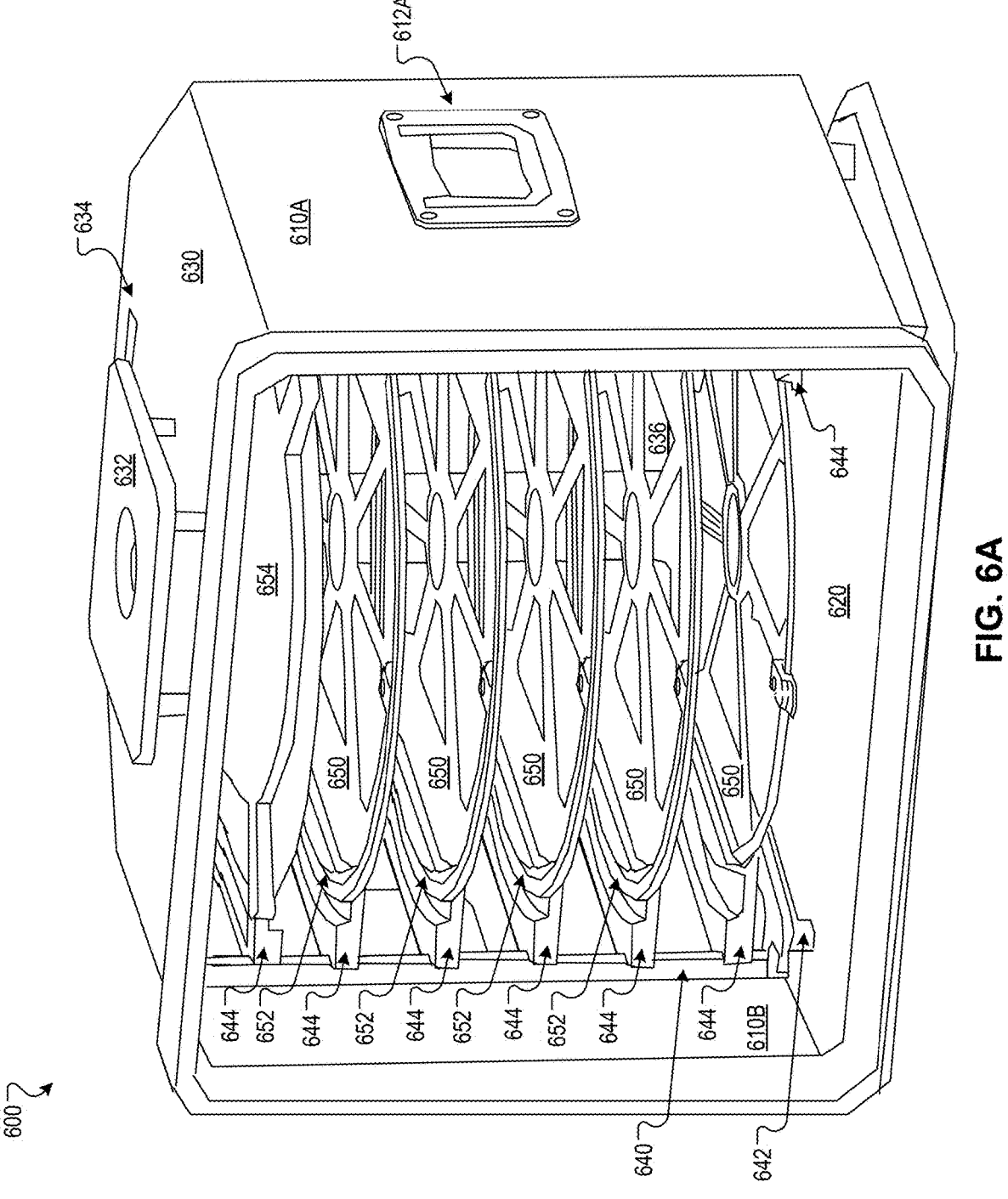
FIGS. 6A-H illustrate shelves of enclosure systems, according to certain embodiments.
Figure 6B:
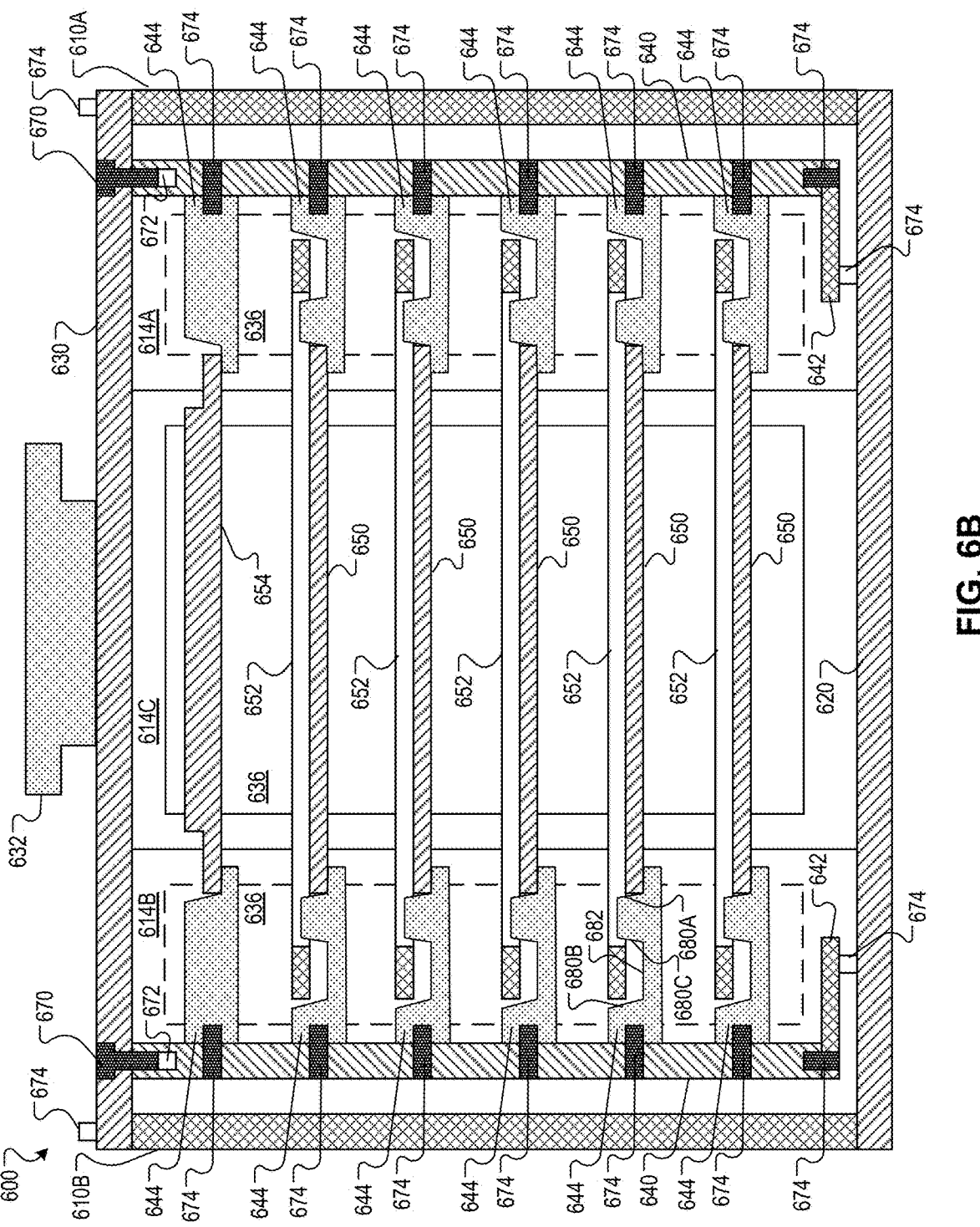
Figure 6C:
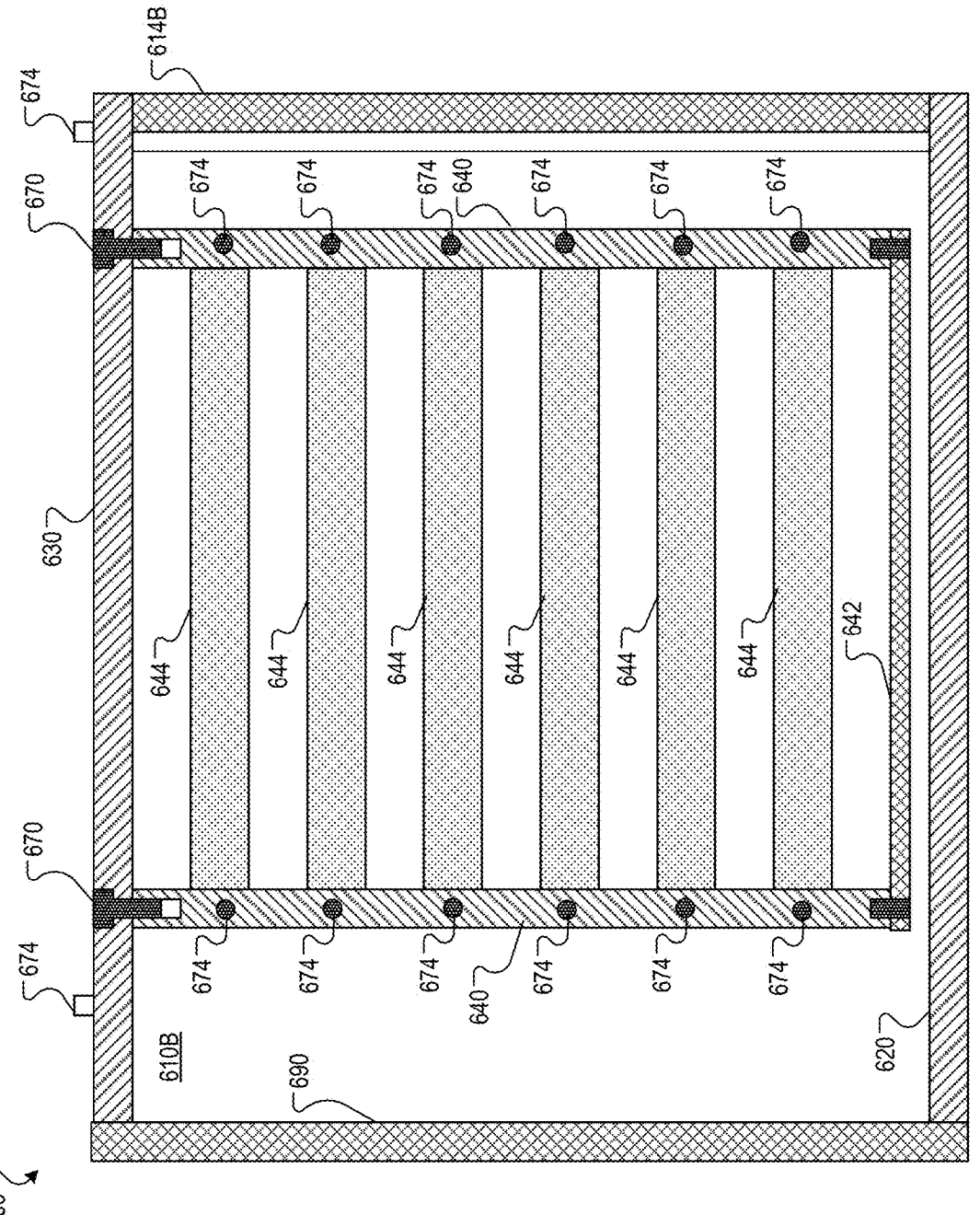
Figure 6D:
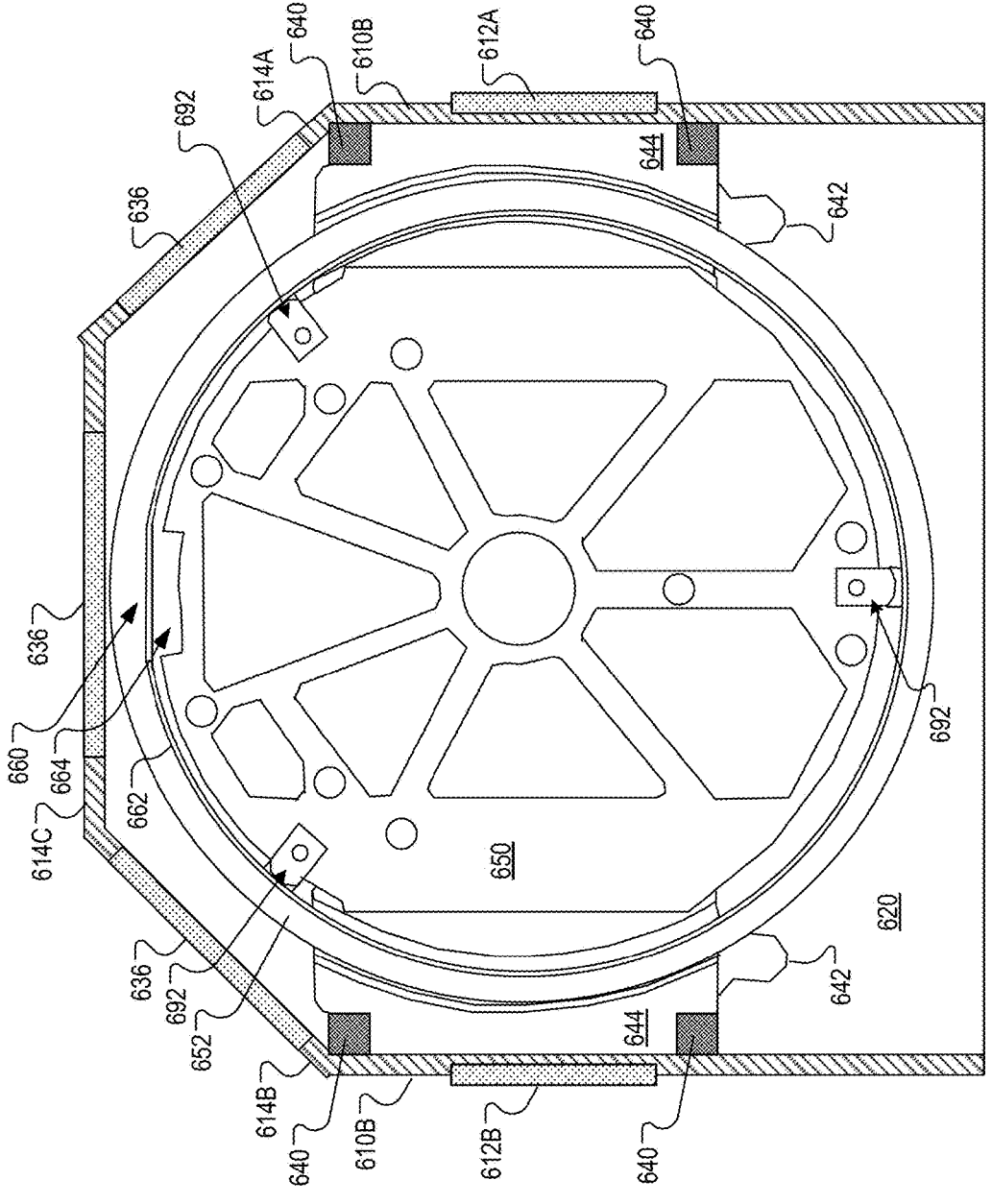
Figures 6E, 6F:
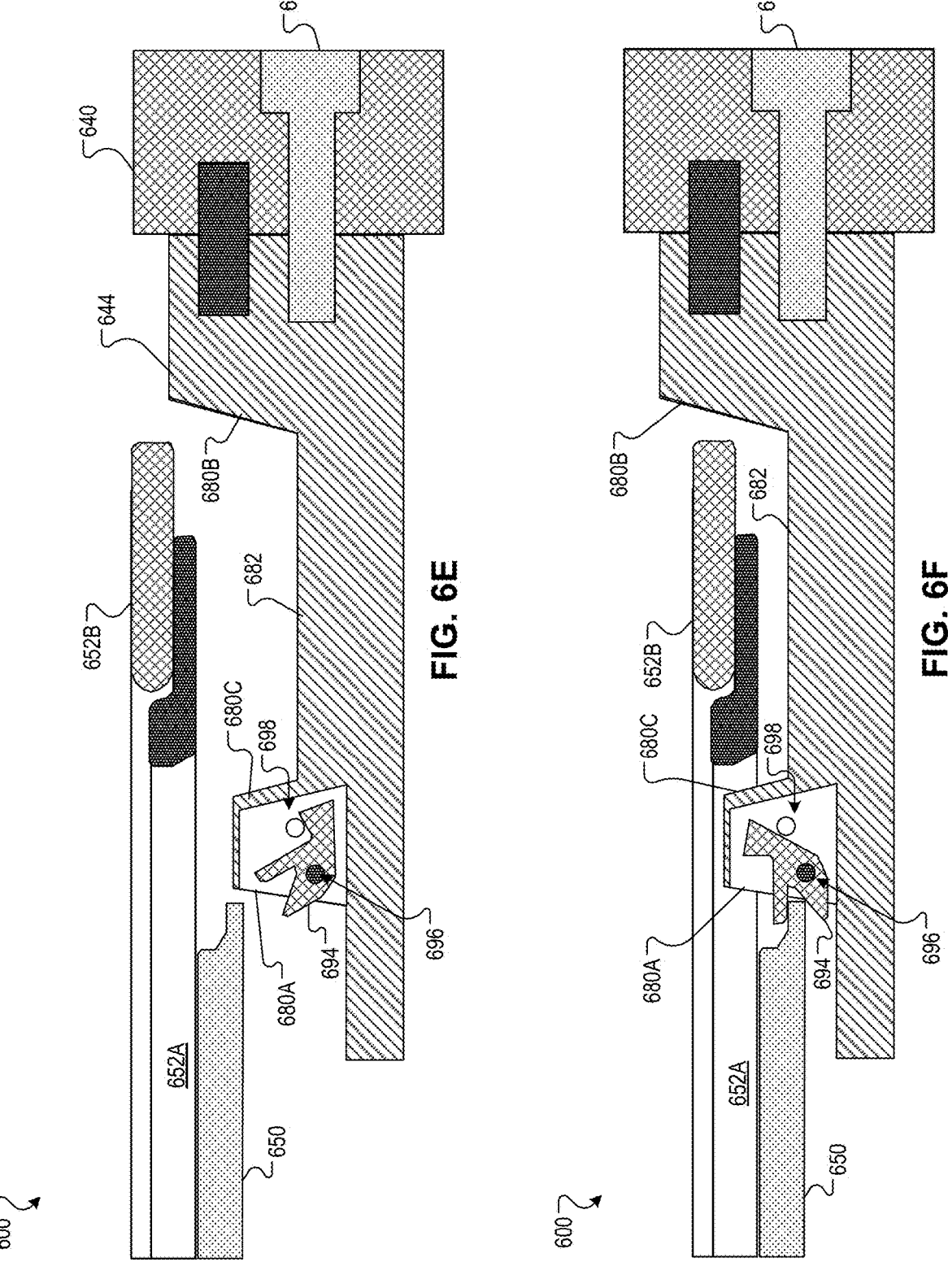
Figure 6H:
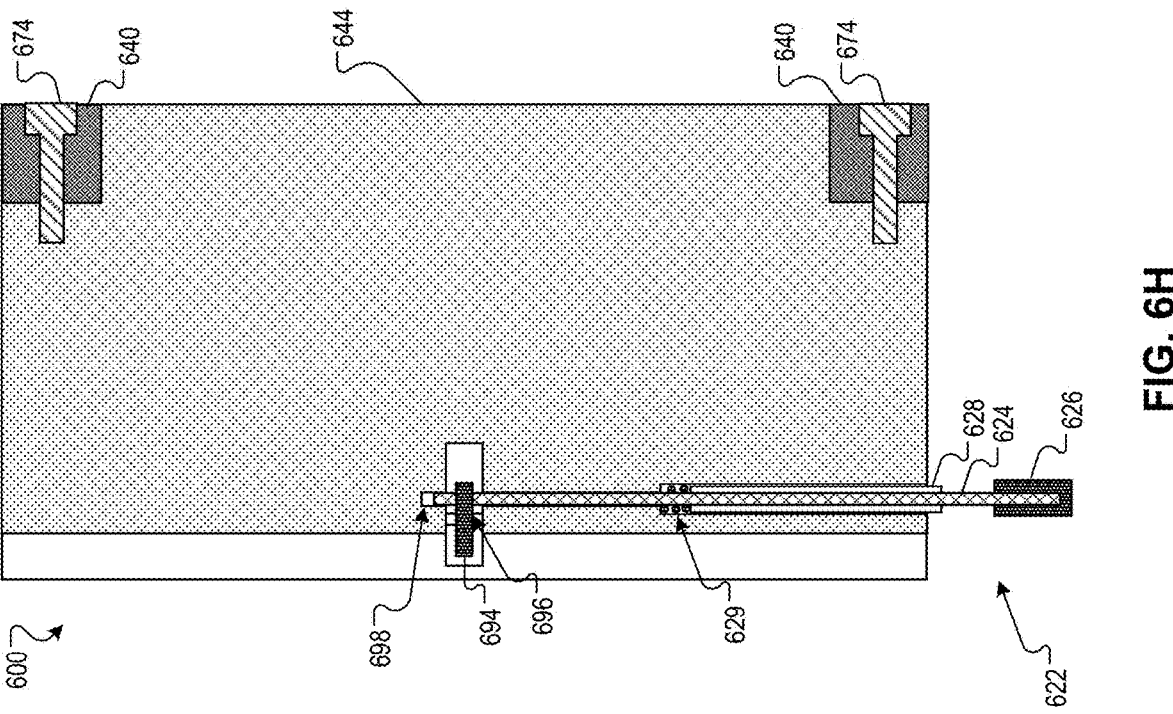
Figure 6G:
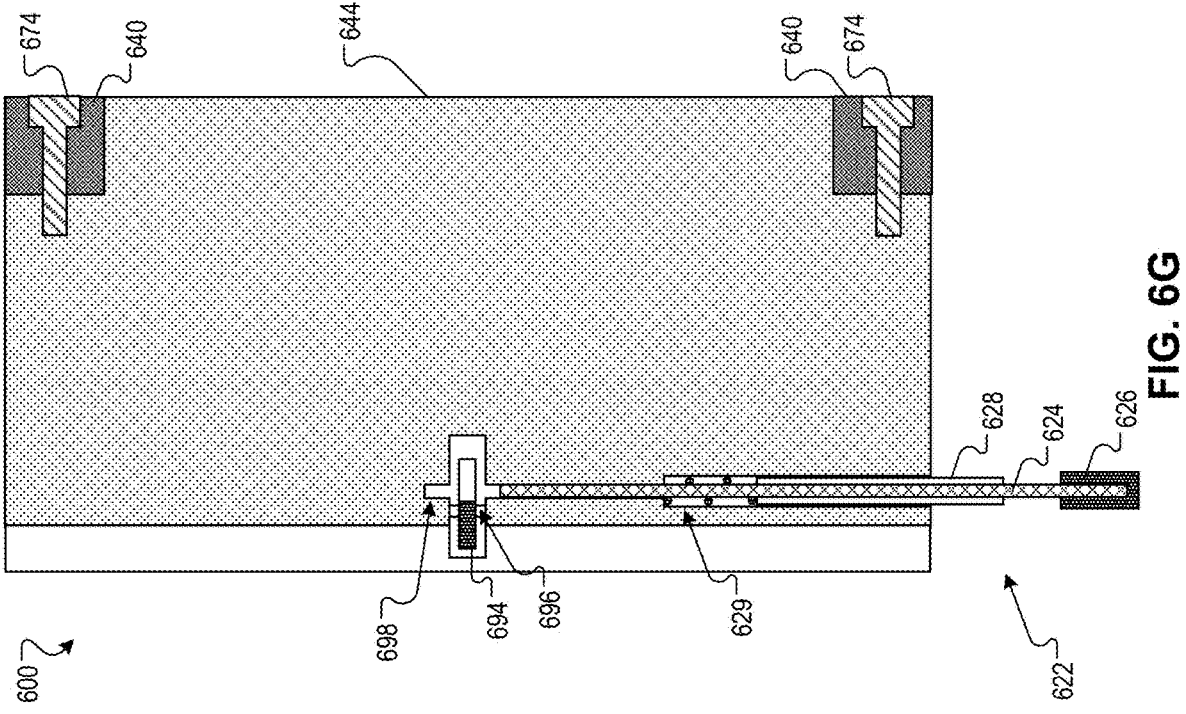

FIGS. 6A-H illustrate views of enclosure systems 600, according to certain embodiments. FIG. 6A illustrates a front perspective view of an enclosure system 600, according to certain embodiments. FIG. 6B illustrates a front cross-sectional view of an enclosure system 600, according to certain embodiments. FIG. 6C illustrates a side cross-sectional view of an enclosure system 600, according to certain embodiments. FIG. 6D illustrates an upper cross-sectional view of an enclosure system 600, according to certain embodiments. FIGS. 6E-F illustrate a front cross-sectional view of a portion of an enclosure system 600, according to certain embodiments. FIGS. 6G-H illustrate an upper cross-sectional view of a portion of an enclosure system 600, according to certain embodiments. In some embodiments, features that have reference numbers that are similar to reference numbers in other figures include similar features and/or functionality as those described in other figures. In some examples, enclosure system 600 of one or more of FIGS. 6A-H has similar features and/or functionality as enclosure system 130 of FIG. 1 and/or enclosure system 200 of FIG. 2.

Referring to FIG. 6A, enclosure system 600 includes sidewalls 610 (e.g., sidewalls 610A-B), one or more rear walls, and bottom wall 620. Enclosure system 600 includes an enclosure lid 630 (e.g., removable upper wall, non-removable upper wall, etc.) coupled to (e.g., top surface mounted, side perimeter mounted) one or more of the walls (e.g., one or more sidewalls 610 and/or one or more rear walls) to at least partially enclose an interior volume of the enclosure system 600. In some embodiments, the enclosure lid 630 is configured to removably attach to one or more of the walls.

In some embodiments, the enclosure lid 630 is attached to an overhead transport component 632. In some embodiments, the enclosure system has one or more windows (e.g., observation windows). In some embodiments, enclosure lid 630 includes an upper window 634 (e.g., upper observation window). In some embodiments, at least one of the rear walls of the enclosure system includes a rear window 636 (e.g., rear observation window).

Posts 640 are coupled to the bottom wall 620 (e.g., via a base connector 642). Shelves 644 are disposed in the interior volume of the enclosure system 600. Each of the shelves 644 may be configured to support a corresponding object (e.g., content 110 of FIG. 1). In some embodiments, each shelf 644 is connected to at least one post 640.

In some embodiments a first set of posts 640 (e.g., a first pair of posts 640, two posts 640) are coupled to the bottom wall 620 (e.g., via the same base connector 642) proximate sidewall 610A and a second set of posts 640 (e.g., a second pair of posts 640, two additional posts 640) are coupled to the bottom wall 620 (e.g., via a different base connector 642) proximate sidewall 610B. A set of shelves 644 (e.g., a pair of shelves 644, two shelves 644, a first shelf 644 and a second shelf 644, coplanar shelves 644) may be used to support an object (e.g., content 110). The first shelf 644 may be attached to the first set of posts 640 and the second shelf 644 may be attached to the second set of posts 640. A first subset of the shelves 644 and a second subset of the shelves 644 may be oriented opposite each other in the interior volume (e.g., are in mirrored locations from each other).

The objects supported by shelves 644 may include a carrier 650, one or more process kit rings 652 disposed on a carrier 650, a placement validation wafer 654, a substrate, and/or the like. In some embodiments a carrier 650 is disposed on a first shelf 644 and a second shelf 644 and one or more process kit rings 652 are disposed on the carrier 650 without the process kit rings 652 contacting the shelves 644. Each shelf 644 may form a recess to guide the process kit ring 652 into the correct location on the carrier 650 responsive to the enclosure system 600 being moved (e.g., jostled, moved rapidly).

In some embodiments, the upper window 634 is configured for orientation verification (e.g., automated or manual orientation verification) of objects disposed in the interior volume. In some embodiments, the rear window 636 is removable for orientation adjustment (e.g., manual or automated orientation adjustment) of one or more of the objects.

In some embodiments, each of the process kit rings 652 has a corresponding flat portion (e.g., flat interior portion) that is viewable via the upper window 634. In some embodiments, each of the process kit rings 652 includes a feature (e.g., notch, perimeter notch, recess, marking, upper surface perimeter notch, etc.) on an upper surface (or lower surface) of the process kit ring 652 that is viewable via the upper window 634. In some embodiments, the flat portion and/or feature (e.g., on an upper surface) of each of the process kit rings 652 are viewable via the upper window 634 at the same time (e.g., simultaneously). In some embodiments, each carrier 650 has a carrier feature that is viewable via the upper window 634 at the same time. In some embodiments, the carrier feature of each carrier 650, the feature on the upper surface of each process kit ring 652, and the flat portion of each process kit ring 652 are viewable at the same time via the upper window 634. Responsive to the flat portion of a process kit ring 652 not being in a correct location or the carrier feature not being in a correct location, the rear window 636 may be removed to adjust orientation of the process kit ring 652 and/or carrier 650. Responsive to the feature of the upper portion of a process kit ring 652 not being viewable via the upper window 634 (e.g., not being in an upward orientation, being flipped over), the enclosure lid 630 and/or the enclosure door are removed to flip the process kit ring 652.

A corresponding upper surface of each of the posts 640 may be configured to removably interface with a corresponding component of the enclosure lid 630. In some embodiments, the corresponding upper surface of each of the posts 640 forms a tapered recess configured to receive a tapered protrusion (e.g., fastener, etc.) coupled to the enclosure lid 630 to align each of the posts 640 with the enclosure lid 630.

Each of the shelves 644 may be configured to align objects (e.g., content 110 of FIG. 1), such as a carrier 650 and/or a process kit ring 652. In some embodiments, each shelf 644 has alignment features and/or surfaces that are configured to align objects on the shelf 644. If a robot arm places an object on shelf 644 in an incorrect position and/or transportation of the enclosure system 600 causes movement of the object, the alignment features and/or surfaces align the object into a correct position. In some embodiments, a shelf 644 has retaining devices configured to secure the object to the shelf 644.

In some embodiments, the interior volume of the enclosure system 600 is a mini environment (e.g., sealed environment). In some embodiments, the interior volume of the enclosure system 600 is kept substantially particle free (e.g., substantially uncontaminated). In some embodiments, the enclosure system 600 includes a fan (e.g., at the top surface) that suppresses any particles in the interior volume. In some embodiments, the interior volume is substantially devoid (or completely devoid) of one or more of moisture, oxygen, particles (e.g., dust), or the like.

One or more of the walls of the enclosure system 600 may form or may be coupled to a front interface. The front interface is configured to interface with (e.g., seal to) a door for transportation of the enclosure system 600 (e.g., and to provide a sealed environment). The front interface is configured to interface (e.g., seal to) a substantially vertical portion of a load port of a substrate processing system. Responsive to the front interface being sealed to a door or the load port, the enclosure system 600 creates a sealed environment (e.g., gases and/or particles do not leave or enter the enclosure system 600 from the surrounding environment outside of the substrate processing system).

In some embodiments, the bottom wall 620 includes or is coupled to a baseplate (e.g., adaptor plate). The baseplate is configured to interface with a horizontal portion of the load port. The baseplate has features (e.g., recesses, receptacles, kinematic interface) to receive kinematic devices (e.g., kinematic pins, precision located pins) of the horizontal portion of the load port. In some embodiments the baseplate is secured to the bottom wall 620 prior to interfacing the enclosure system 600 with the load port. In some embodiments, the baseplate is secured to the load port and then the bottom wall 620 is secured to the baseplate. In some embodiments, the enclosure system 600 has a seal (e.g., crushable seal, gasket) to seal one or more openings in the bottom wall 620.

In some embodiments, one or more of an overhead transport component 632 (e.g., overhead transport flange) or at least one handle 612 is coupled to one or more surfaces of the enclosure system 600 for transport (e.g., automated transport, manual transport, etc.) of the enclosure system 600. In some embodiments, the overhead transfer (OHT) component 632 is coupled (e.g., attached) to the enclosure lid 630. In some embodiments, handle 612A is disposed on a sidewall 610A and a second handle is disposed on sidewall 610B.

In some embodiments, one or more purge adaptors are disposed in the bottom wall 620 (e.g., inserted into openings formed in the bottom wall 620). The purge adaptors are used to one or more of fill the enclosure system 600 with a gas (e.g., Nitrogen ($N_2$)), remove gas from the enclosure system, pass a gas through the enclosure system 600, or the like. The purge adaptors extend through the baseplate to fluidly couple with one or more of a gas or vacuum line (e.g., for purging the enclosure system 600, for creating a vacuum in the enclosure system 600, for filling the enclosure system 600 with a gas, etc.). Each of the purge adaptors provides a seal at a corresponding opening in the bottom wall 620 (e.g., to provide a sealed environment). In some embodiments, the enclosure system 600 seals to the load port responsive to being docked to the load port. The interior volume of the enclosure system 600 is configured to be purged via the one or more purge adaptors prior to opening of the enclosure system 600.

Referring to FIG. 6B, enclosure system 600 includes walls that include one or more of sidewalls 610A-B, rear walls 614A-C, and/or bottom wall 620. An enclosure lid 630 is configured to couple to one or more of the walls of enclosure system 600 (e.g., via one or more fasteners 674, such as button head screws). The enclosure lid 630 includes an upper window. One or more of the rear walls 614 includes a rear window 636. One or more of the rear windows 636 are removable to adjust orientation of one or more of the carriers 650, process kit rings 652, and/or placement validation wafer 654. An overhead transportation component 632 may be coupled to the enclosure lid 630.

Posts 640 are coupled to the bottom wall 620 (e.g., via base connector 642 and one or more fasteners 674). The posts 640 removably interface with enclosure lid 630. In some embodiments, an upper surface of each post 640 forms a recess 672 and a component 670 (e.g., fastener 674, protrusion, pilot pin, etc.) of the enclosure lid 630 interfaces with the recess 672 (e.g., sleeve, plastic sleeve, nylon sleeve, etc.). In some embodiments, the recess 672 is tapered recess and the component 670 is a tapered protrusion to align the enclosure lid 630 with the posts 640. Shelves 644 are coupled (e.g., via fasteners 674) to the posts 640. A carrier 650 is disposed on two shelves 644. A placement validation wafer 654 is disposed on two shelves. One or more process kit rings are disposed on a carrier 650 (e.g., without the one or more process kit rings 652 contacting a shelf 644).

In some embodiments, a shelf 644 includes a sloped surface 680A to align the carrier 650 on the shelf 644. In some embodiments, a shelf 644 includes a recess 682 (e.g., pocket of deep pocket shelves 644) formed by sloped surfaces 680B-C to align the process kit ring 652 on the carrier 650 responsive to movement of the enclosure system 600 (e.g., jostling, rapid movement, etc.).

Referring to FIG. 6C, each shelf 644 may be coupled (e.g., fastened, attached, etc.) via fasteners 674 to two posts

640. The two posts 640 are coupled to the bottom wall 620 via the same base connector 642. In some embodiments, an enclosure door 690 is configured to removably couple (e.g., attach, clamp, seal, etc.) to one or more of the walls and/or enclosure lid 630 of the enclosure system 600.

Referring to FIG. 6D, process kit ring 652 has a flat surface 660 (e.g., flat inside surface, etc.) and/or an upper surface feature 662 (e.g., notch, marking, recess, etc.) of each of the process kit rings 652 that are to be viewable via the upper window. Responsive to the flat surface 660 not being in a correct location in the view via the upper window, the orientation of the process kit ring 652 is to be adjusted (e.g., rotated to be located in the correct location). Responsive to the upper surface feature 662 not being viewable, the process kit ring 652 is to be flipped (e.g., so that the upper surface feature 662 is oriented upwards instead of downward). In some embodiments, the carrier has a carrier feature 664 (e.g., recess, cut-out) that is disposed proximate the flat surface 660 of the process kit ring 652. The carrier feature 664 is viewable via the upper window of the enclosure lid to determine whether the carrier 650 is oriented correctly. In some embodiments, the carrier 650 includes fingers 692 that support the process kit ring 652.

Referring to FIGS. 6E-F, a carrier 650 supporting one or more process kit rings 652 (e.g., process kit rings 652A-B) is to be lowered onto a shelf 644. The shelf is connected to a post 640 via a fastener 674. In some embodiments, a component 676 further couples the shelf 644 to the post 640. In some examples, the shelf is connected to the post 640 via one or more components 676 (e.g., pilot pin, etc.) and then the fastener 674 secures the shelf 644 to the post 640.

In some embodiments a set of process kit rings 652 stacked on top of each other are supported by carrier 650. In some embodiments, a shelf 644 includes a sloped surface 680A (e.g., carrier alignment feature) to align the carrier 650 on the shelf 644. In some embodiments, a shelf 644 includes a recess 682 (e.g., pocket of deep pocket shelves 644) formed by sloped surfaces 680B-C (e.g., process kit ring alignment features) to align the process kit ring 652 on the carrier 650 responsive to movement of the enclosure system 600 (e.g., jostling, rapid movement, etc.). In some embodiments, the process kit rings 652 are disposed above or in recess 682 without contacting shelf 644.

In some embodiments, shelf 644 includes a carrier retaining device 694 (e.g., carrier retaining device 460 of FIGS. 4A-E, self-actuating hook to secure the carrier 650). Upon lowering the carrier 650 (e.g., supporting process kit rings 652, lowering via a robot arm) onto shelf 644 (e.g., sloped surface 680A), the carrier 650 engages with (e.g., pushes down) a first end portion of a carrier retaining device 694, causing a second end portion of the carrier retaining device 694 to retain the carrier 650. The carrier retaining device 694 may rotate about an axis 696 from a non-securing position to a securing position. In some examples, lowering the carrier 650 onto the first end portion of the carrier retaining device 694 rotates the carrier retaining device 694 (e.g., about axis 696) so that the first end portion is pushed into the shelf 644 (e.g., to be substantially parallel with the first upper surface of shelf 644) and the second end portion is rotated to a position above at least a portion of the carrier 650. In some embodiments, a locking device (e.g., locking device 480 of FIGS. 4A-E) is configured to insert into a recess 698 (e.g., responsive to securing the door 690 to the enclosure system 600) to lock the carrier retaining device 694 in a non-securing position or into a securing position. By placing the carrier 650 on the shelf 644 which rotates the carrier retaining device 694 from a non-securing position (e.g., FIG. 6E) to a securing position (e.g., FIG. 6F) and securing the door 690 to the enclosure system 600 to insert the locking device into the recess 698, the carrier is secured by the carrier retaining device 694 until the door 690 is removed from the enclosure system 600.

Referring to FIGS. 6G-H, the carrier retaining device 694 (e.g., latch, PET latch) may pivot about an axis 696 (e.g., pin). A locking device 622 may include a rod 624 (e.g., stainless steel rod), a cap 626 (e.g., to contact door 690, ultra high molecular weight (UHMW) polyethylene cap, etc.), a guide component 628 (e.g., guide, connector nut, UHMW polyethylene guide, etc.), and/or a spring 629. In a non-locked position (e.g., without the door 690 secured to the enclosure system 600), the spring 629 is expanded, removing the rod 624 from the recess 698 which allows the carrier retaining device 694 to move between the secured position and non-secured position. In a locked position (e.g., with the door 690 secured to the enclosure system 600, the spring 629 is compressed and the rod 624 is in the recess 698 which prevents the carrier retaining device 694 from moving between the secured position and the non-secured position (e.g., locking the carrier 650 to the shelf 644).

In some embodiments, each shelf 644 includes a carrier retaining device 694 and/or a locking device 622. In some embodiments, two shelves 644 that are coplanar (e.g., both support the same carrier 650) both include a carrier retaining device 694 and/or a locking device 622. In some embodiments, at least one of the two shelves 644 that are coplanar (e.g., both support the same carrier 650) includes a carrier retaining device 694 and/or a locking device 622.

Unless specifically stated otherwise, terms such as "transporting," "moving," "lowering," "causing," "securing," "removing," "placing," "disposing," "actuating," "locating," "closing," "locking," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or it includes a general purpose computer system selectively programmed by a computer program stored in the computer system. In some embodiments, such a computer program is stored in a computer-readable tangible storage medium.

The methods and illustrative examples described herein are not inherently related to any particular computer or other apparatus. Various general purpose systems can be used in accordance with the teachings described herein, or a more specialized apparatus can be constructed to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations are performed in an inverse order so that certain operations are performed, at least in part, concurrently with other operations. In another embodiment, instructions or sub-operations of distinct operations are in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A shelf system comprising:
   a first distal portion comprising a first distal end and a second distal end opposite the first distal end, the second distal end being configured to be fastened to a first surface of an enclosure system of a substrate processing system, the first distal portion comprising:
   a first planar surface that extends from the first distal end to a first sidewall;
   a first carrier alignment feature comprising the first sidewall that extends upwards from the first planar surface;
   a second planar surface that extends from the second distal end to a second sidewall; and
   a first process kit ring alignment feature comprising the second sidewall that extends upwards from the second planar surface; and
   a second distal portion configured to be fastened to a second surface of the enclosure system, the second distal portion comprising a second carrier alignment feature and a second process kit ring alignment feature, wherein the first carrier alignment feature and the second carrier alignment feature are configured to be disposed proximate outer surfaces of a carrier to align the carrier in the enclosure system, and wherein the first process kit ring alignment feature and the second process kit ring alignment feature are configured to be proximate inner surfaces of a process kit ring to align the process kit ring on the carrier in the enclosure system.

2. The shelf system of claim 1, wherein the first distal portion and the second distal portion are connected to each other by a third portion of the shelf system.

3. The shelf system of claim 2, wherein the third portion comprises a ring alignment feature configured to further align the process kit ring on the carrier in the enclosure system.

4. The shelf system of claim 1, wherein a first shelf comprises the first distal portion and a second shelf comprises the second distal portion.

5. The shelf system of claim 1, wherein:
the second carrier alignment feature comprises a third sidewall; and
the first sidewall and the third sidewall are configured to prevent x-direction movement and yaw movement of the carrier.

6. The shelf system of claim 1, wherein the second process kit ring alignment feature comprises a fourth sidewall.

7. The shelf system of claim 1, wherein at least one of:
the first distal portion further comprises a corresponding carrier retaining device configured to secure the carrier to a corresponding upper surface of the first distal portion; or
the second distal portion further comprises a respective carrier retaining device configured to secure the carrier to a respective upper surface of the second distal portion.

8. An enclosure system of a substrate processing system, the enclosure system comprising:
a plurality of surfaces that at least partially enclose an interior volume of the enclosure system; and
a shelf system comprising:
a first distal portion comprising a first distal end and a second distal end opposite the first distal end, the second distal end being fastened to a first surface of the enclosure system, the first distal portion comprising:
a first planar surface that extends from the first distal end to a first sidewall;
a first carrier alignment feature comprising the first sidewall that extends upwards from the first planar surface;
a second planar surface that extends from the second distal end to a second sidewall; and
a first process kit ring alignment feature comprising the second sidewall that extends upwards from the second planar surface; and
a second distal portion fastened to a second surface of the enclosure system, the second distal portion comprising a second carrier alignment feature and a second process kit ring alignment feature, wherein the first carrier alignment feature and the second carrier alignment feature are configured to be disposed proximate outer surfaces of a carrier to align the carrier in the enclosure system, and wherein the first process kit ring alignment feature and the second process kit ring alignment feature are configured to be proximate inner surfaces of a process kit ring to align the process kit ring on the carrier in the enclosure system.

9. The enclosure system of claim 8, wherein the first distal portion and the second distal portion are connected to each other by a third portion of the shelf system.

10. The enclosure system of claim 9, wherein the third portion comprises a ring alignment feature configured to further align the process kit ring on the carrier in the enclosure system.

11. The enclosure system of claim 8, wherein a first shelf comprises the first distal portion and a second shelf comprises the second distal portion.

12. The enclosure system of claim 8, wherein:
the second carrier alignment feature comprises a third sidewall; and
the first sidewall and the third sidewall are configured to prevent x-direction movement and yaw movement of the carrier.

13. The enclosure system of claim 8, wherein the second process kit ring alignment feature comprises a fourth sidewall.

14. The enclosure system of claim 8, wherein at least one of:
the first distal portion further comprises a corresponding carrier retaining device configured to secure the carrier to a corresponding upper surface of the first distal portion; or
the second distal portion further comprises a respective carrier retaining device configured to secure the carrier to a respective upper surface of the second distal portion.

15. A method comprising:
transporting a carrier supporting a process kit ring to a position above a shelf system disposed within an enclosure system of a substrate processing system; and
lowering the carrier supporting the process kit ring onto the shelf system to cause the carrier to be aligned via a first carrier alignment feature of a first distal portion and a second carrier alignment feature of a second distal portion of the shelf system and to cause the process kit ring to be aligned via a first process kit ring alignment feature of the first distal portion and a second process kit ring alignment feature of the second distal portion of the shelf system, the first distal portion comprising a first distal end and a second distal end opposite the first distal end, the first distal portion further comprising a first planar surface that extends from the first distal end to a first sidewall, the first carrier alignment feature comprising the first sidewall that extends upwards from the first planar surface, the first distal portion further comprising a second planar surface that extends from the second distal end to a second sidewall, the first process kit ring alignment feature comprising the second sidewall that extends upwards from the second planar surface, wherein the second distal end of the first distal portion is fastened to a first surface of the enclosure system and the second distal portion is fastened to a second surface of the enclosure system, wherein the first carrier alignment feature and the second carrier alignment feature are configured to be disposed proximate outer surfaces of the carrier, and wherein the first process kit ring alignment feature and the second process kit ring alignment feature are configured to be proximate inner surfaces of the process kit ring.

16. The method of claim 15, wherein the first distal portion and the second distal portion are connected to each other by a third portion of the shelf system.

17. The method of claim 16, wherein the third portion comprises a ring alignment feature configured to further align the process kit ring on the carrier in the enclosure system.

18. The method of claim 15, wherein a first shelf comprises the first distal portion and a second shelf comprises the second distal portion.

19. The method of claim 15, wherein:

the second carrier alignment feature comprises a third sidewall; and the first sidewall and the third sidewall are configured to prevent x-direction movement and yaw movement of the carrier.

20. The method of claim 15, wherein the second process kit ring alignment feature comprises a fourth sidewall.

\* \* \* \* \*